(12) United States Patent
Holland

(10) Patent No.: US 12,263,476 B2
(45) Date of Patent: Apr. 1, 2025

(54) MICROFLUIDIC DEVICE AND USES OF TEACHING SCIENTIFIC PRINCIPLES

(71) Applicant: West Virginia University, Morgantown, WV (US)

(72) Inventor: Lisa Holland, Morgantown, WV (US)

(73) Assignee: WEST VIRGINIA UNIVERSITY, Morgantown, VA (US)

( * ) Notice: Subject to any disclaimer, the term of this patent is extended or adjusted under 35 U.S.C. 154(b) by 1583 days.

(21) Appl. No.: 16/381,535

(22) Filed: Apr. 11, 2019

(65) Prior Publication Data

US 2019/0314811 A1    Oct. 17, 2019

Related U.S. Application Data

(60) Provisional application No. 62/655,859, filed on Apr. 11, 2018.

(51) Int. Cl.
*B01L 3/00* (2006.01)
*B81B 1/00* (2006.01)
*G09B 23/12* (2006.01)
*G09B 23/24* (2006.01)

(52) U.S. Cl.
CPC ............. *B01L 3/5027* (2013.01); *B01L 3/527* (2013.01); *B81B 1/006* (2013.01); *G09B 23/12* (2013.01); *G09B 23/24* (2013.01)

(58) Field of Classification Search
CPC ........ B01L 3/5027; B01L 3/527; B81B 1/006; G09B 23/12; G09B 23/24
See application file for complete search history.

(56) References Cited

U.S. PATENT DOCUMENTS

2004/0089616 A1*  5/2004  Kellogg ................. H01R 39/64
                                                210/600
2012/0039769 A1*  2/2012  Wo ...................... B01L 3/50273
                                                422/504

* cited by examiner

*Primary Examiner* — Robert J Eom
(74) *Attorney, Agent, or Firm* — Thomas | Horstemyer, LLP

(57) ABSTRACT

Described herein are embodiments of a microfluidic device configured to facilitate conceptualization of scientific principles and uses thereof.

20 Claims, 22 Drawing Sheets

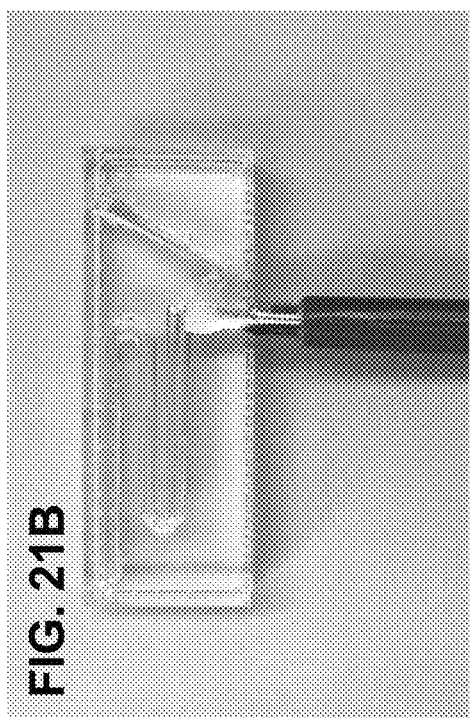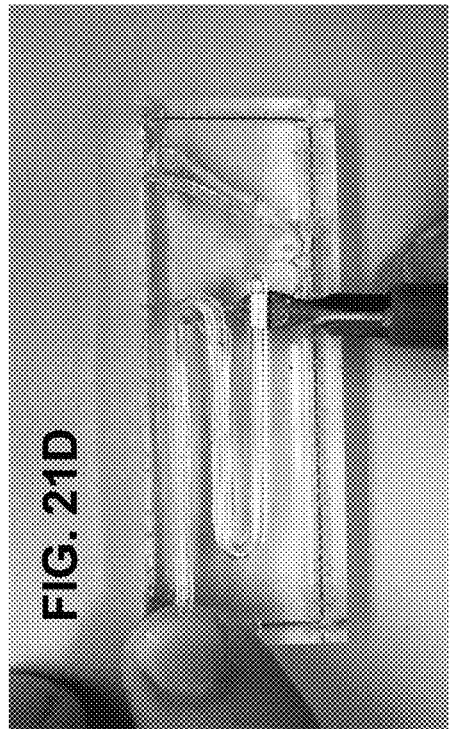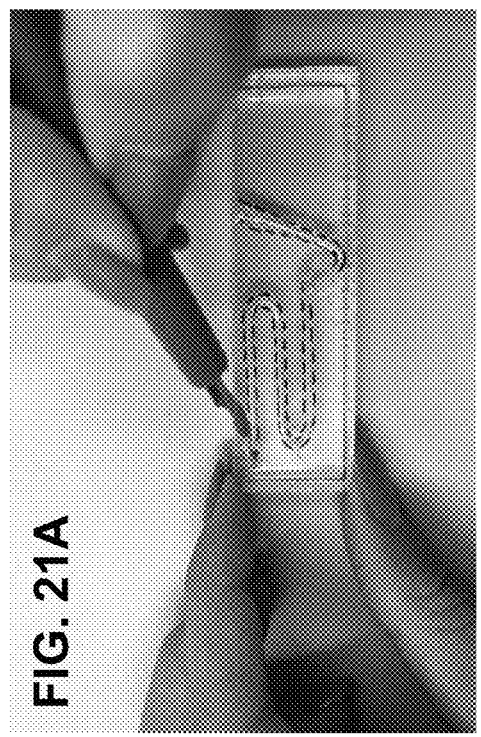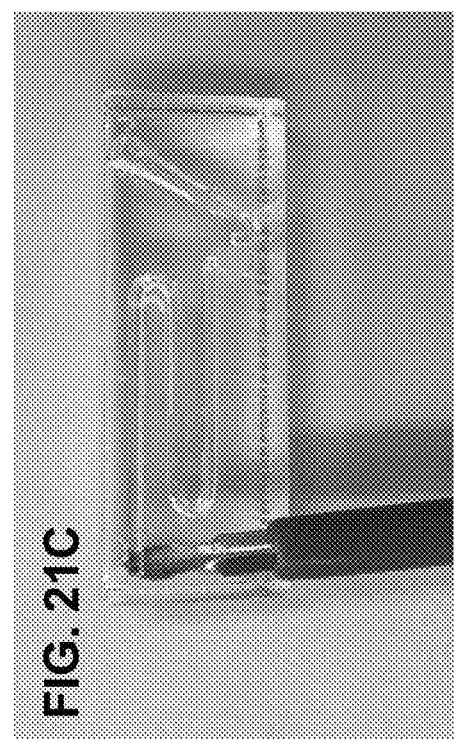

MICROFLUIDIC DEVICE AND USES OF TEACHING SCIENTIFIC PRINCIPLES

CROSS-REFERENCE TO RELATED APPLICATIONS

This application claims the benefit of and priority to U.S. Provisional Patent Application No. 62/655,859, filed on Apr. 11, 2018, entitled "MICROFLUIDIC DEVICE AND USES OF TEACHING SCIENTIFIC PRINCIPLES," the contents of which is incorporated by reference herein in its entirety.

STATEMENT REGARDING FEDERALLY SPONSORED RESEARCH

This invention was made with government support under grant number CHE1506984 awarded by the National Science Foundation. The government has certain rights in the invention.

BACKGROUND

Stoichiometry, limiting reagents, and the ideal gas law, for example, are difficult topics for students to conceptualize using traditional teaching approaches. As such, there exists a need for improved teaching approaches for teaching those and other difficult to conceptualize concepts to students.

BRIEF DESCRIPTION OF THE DRAWINGS

Further aspects of the present disclosure will be readily appreciated upon review of the detailed description of its various embodiments, described below, when taken in conjunction with the accompanying drawings.

FIG. 2 shows an embodiment of a mold that includes three glass pieces that are attached to a microscope slides. The glass pieces are in the desired shape of the microcapilary(ies) of the microfluidic device. The design included three separate pieces fixed or attached to a microscope slide: a hook portion, a circle or spherical portion, and a serpentine portion.

FIGS. 7A-7B show the same delivery method but in two different microfluidic devices.

FIGS. 9A-9C show the same delivery method but in different microfluidic devices.

FIG. 12A shows the device being filled with a solution of sodium bicarbonate dyed with food color. FIGS. 12B-12C shows the formation of gas as the reaction occurs. FIG. 12D shows the displacement of the colored reactant by the gas formed as the reaction is complete. FIG. 12E shows the mark that was added where the gas and colored reagent meet after displacement of the colored liquid by the gas.

FIGS. 21A-21D shows a series of images that can demonstrate removal of the mold from the formed microfluidic device.

DETAILED DESCRIPTION

Figure 1:
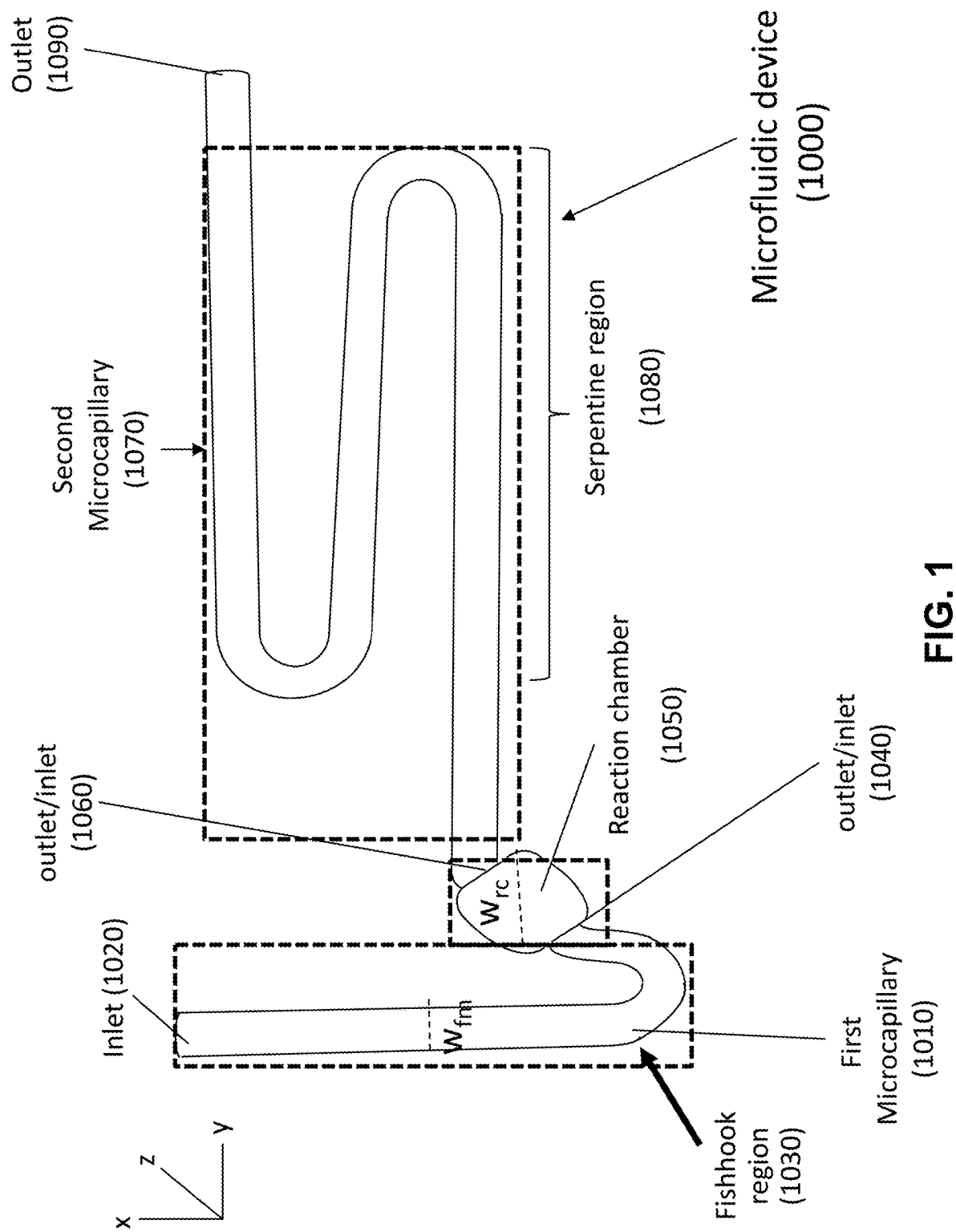
FIG. 1 shows and image of an embodiment of a microfluidic device configured to demonstrate various scientific concepts.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by reference as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further aspect includes from the one particular value and/or to the other particular value. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used in the specification and the appended claims, the singular forms "a," "an," and "the" include plural referents unless the context clearly dictates otherwise.

As used herein, "about," "approximately," "substantially," and the like, when used in connection with a numerical variable, can generally refers to the value of the variable and to all values of the variable that are within the experimental error (e.g., within the 95% confidence interval for the mean) or within +/−10% of the indicated value, whichever is greater. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Embodiments of the present disclosure will employ, unless otherwise indicated, techniques of chemistry, organic chemistry, biochemistry, physics, and the like, which are within the skill of the art. Such techniques are explained fully in the literature.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible unless the context clearly dictates otherwise.

Definitions

As used herein, "about," "approximately," and the like, when used in connection with a numerical variable, can generally refers to the value of the variable and to all values of the variable that are within the experimental error (e.g., within the 95% confidence interval for the mean) or within +/−10% of the indicated value, whichever is greater.

Discussion

Stoichiometry, limiting reagents, and the Ideal Gas Law are concepts that are typically difficult for most students to comprehend using traditional book and lecture methods of teaching. Anatomy models, physics science kits, and chemistry science kits have been developed to provide a hands-on interactive approach to learning various topics within these subjects.

However, there are limited teaching tools available that provide students with the equivalent modality of learning for stoichiometry, limiting reagents, and the Ideal Gas Law. As such, there exists a need for a hands-on cost efficient, safe, and effective method to teach difficult concepts to students, such as stoichiometry, limiting reagents, and the Ideal Gas Law.

With that said, described herein are microfluidic devices that can be configured to demonstrate stoichiometry, limiting reagents, and the Ideal Gas Law to students. Also described herein are methods of fabricating the microfluidic devices. Also described herein are methods of using the microfluidic devices to demonstrate stoichiometry, limiting reagents, and/or the Ideal Gas Law. Other compositions, devices, methods, features, and advantages of the present disclosure will be or become apparent to one having ordinary skill in the art upon examination of the following drawings, detailed description, and examples. It is intended that all such additional compositions, compounds, methods, features, and advantages be included within this description, and be within the scope of the present disclosure.

Microfluidic Devices

Figure 13:
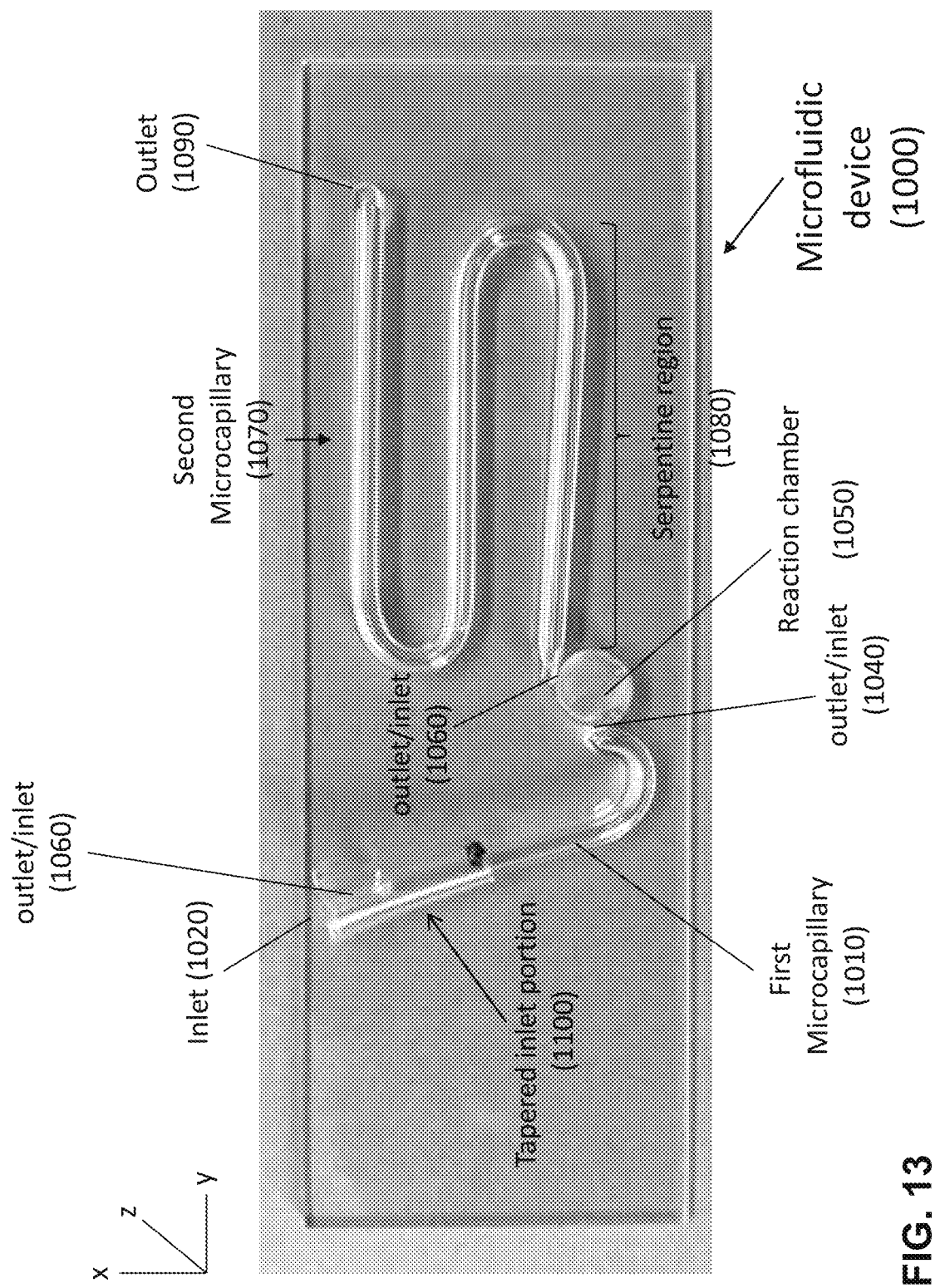
FIG. 13 shows an image of an embodiment of a finished microfluidic device as described herein.
Figure 14A:
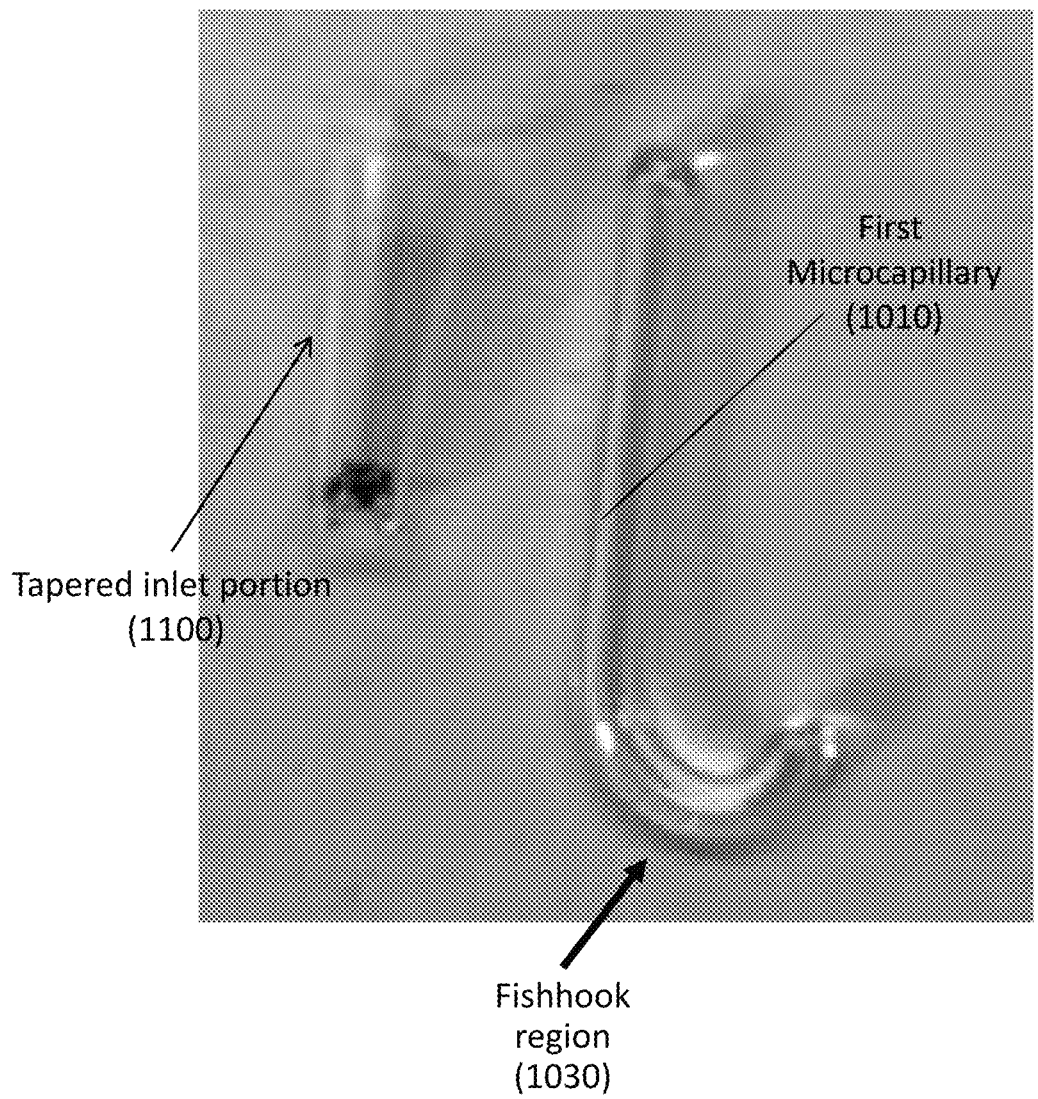
FIGS. 14A-14B shows images of an embodiment of a first micropillary having a tapered inlet portion that can be removably coupled to a non-region.
Figure 14B:
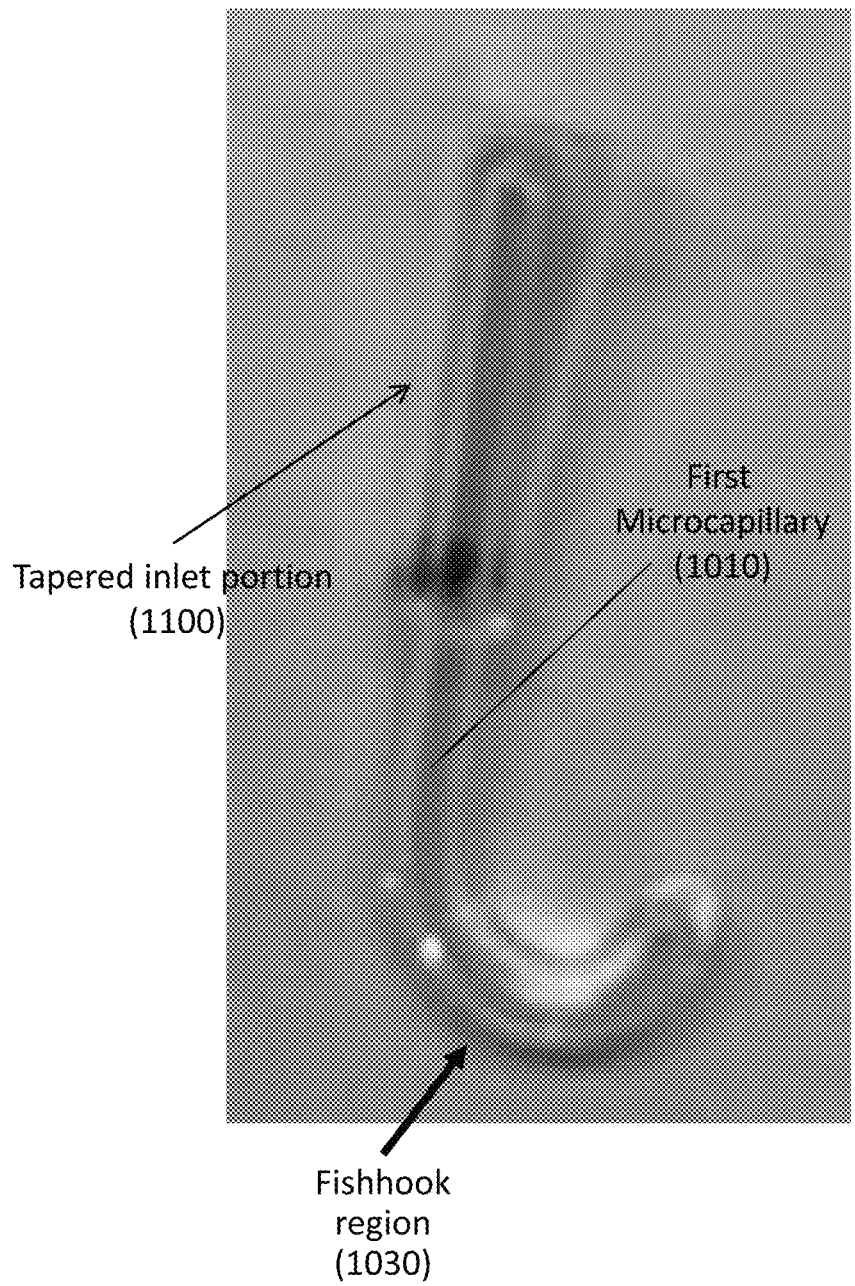

As shown in e.g. FIG. 1, described herein are various aspects of a microfluidic device 1000 that can include a first microcapillary 1010. The first microcapillary 1010 can have an end region having a hook shape ("fishhook region" 1030). The first microcapillary 1010 can have an inlet 1020, wherein the inlet 1020 can be at the end opposite the end region having the hook shape ("fishhook region" 1030). In some embodiments, such as those shown in FIGS. 13-14B, the first microcapillary can have a tapered inlet portion 1100 that can extend from the inlet 1020 to a point on the first microcapillary between the inlet and the fishhook region 1030. The tapered inlet portion 1100 can be configured such that the cross sectional width (or diameter) decreases along the length of the first microcapillary 1010 towards the fishhook region. Thus, in these embodiments, the inlet 1020 can have a larger width (or diameter) than the width of the rest of the tapered inlet region 1100 or the non-tapered portion of the first microcapillary 1010. In some aspects, the tapered portion can better accommodate some solution delivery devices such as some pipette tips.

The first microcapillary 1010 can have outlet 1040. The outlet 1040 can be at the end of the first microcapillary 1010 opposite the end of the first microcapillary 1010 having the inlet 1020. The outlet 1040 of the first microcapillary 1010 can be at a lower height (as measured along the x axis) than the inlet 1020 of the microfluidic device 1000. The microfluidic device 1000 can have a reaction chamber 1050. The reaction chamber 1050 can have an inlet 1040 (also can be the outlet of the first microcapillary 1010) and an outlet 1060. The inlet 1040 of the reaction chamber can be coupled to or be the same as the outlet 1040 of the first microcapillary 1010. The inlet 1040 of the reaction chamber 1050 can be positioned at a height lower (as measured along the x axis) than the outlet 1060 of the reaction chamber 1050. The reaction chamber 1050 can have a greater width (or diameter) ($w_{rc}$) than the width (or diameter) first microcapillary ($w_{fm}$). The microfluidic device 1000 can have a second microcapillary 1070. The second microcapillary 1070 can have an inlet 1060 and an outlet 1090. The second microcapillary 1070 can be serpentine shaped in at least one region between the inlet and the outlet of the second microcapillary ("serpentine region" 1080). The inlet 1060 of the second microcapillary 1070 can be coupled to or be the same as the outlet 1060 of the reaction chamber. The inlet 1060 of the second microcapillary 1070 can be at a lower height (as measured along the x-axis) than the outlet 1090 of the second microcapillary 1070 in the microfluidic device 1000.

The first microcapillary 1010 can allow introduction of various reagents into the microfluidic device 1000. The fish-hook portion 1030 of the first microcapillary 1010 can prevent bubbles from entering the reaction chamber 1050. By placing the outlet 1040 of the first microcapillary 1010 (which can also be the inlet to the reaction chamber) lower than the inlet of the first microcapillary 1010, gravity can be relied upon to drive reagents into the reaction chamber 1050. In some aspects, a method(s), device(s), and/or technique(s) to force the reagents, hydrodynamic pressure can be relied upon to drive reactants into the reaction chamber. The reaction chamber 1050 can allow for mixing of the reagent(s) present in the microfluidic device 1000 to allow for reactions to occur. The reaction chamber 1050 can allow for a particular volume of reagents to be used to generate the reaction. The reaction chamber 1050 can be a different diameter or width (depending on shape) than the first microcapillary 1010 to provide a change in the flow characteristics of a reagent in the microfluidic device 1000 and can promote mixing of reagent(s) in the reaction chamber 1050. The reaction chamber 1050 also can provide space to allow gas bubbles that are generated in the reaction to flow up into the second microcapillary 1070 that can contain a serpentine region 1080. The outlet of the reaction chamber 1060 (which can also be the inlet to the second microcapillary 1070) can be located higher than the inlet 1040 to the reaction chamber 1050 such that as gas bubbles rise they exit the reaction chamber 1050 but do not exit into the first microcapillary 1010. This configuration of the reaction chamber 1050 can also ensure that a region of continuous gas is created in the second microcapillary 1070, which can allow for improved accuracy in determining how much fluid is displaced by the gas.

The microfluidic device 1000 or any component thereof can be made out of any suitable material. The microfluidic device 1000 can be composed of one or more polymers and/or copolymers (e.g. a plastic), ceramic, metal, glass, or any combination thereof. One or more regions or parts of the microfluidic device 1000 can be opaque. One or more regions or parts of the microfluidic device 1000 can be semi-optically transparent. One or more regions or parts of the microfluidic device 1000 can be optically transparent. The microfluidic device 1000 can be entirely optically transparent. The second microcapillary 1070 and the first microcapillary 1000 and/or the reaction chamber 1050 can be optically transparent. In some embodiments, one, more than one, or all components of the microfluidic device 1000 can be poly(dimethylsiloxane) (PDMS). The microfluidic device 1000 and any component thereof can be non-toxic.

The microfluidic device 1000 and any component thereof can be bacterial resistant. The microfluidic device 1000 and any component thereof can be easily cleaned with ordinary household soaps, surfactants, and/or cleaners.

The first microcapillary 1010, second microcapillary 1070, and/or reaction chamber 1050 can be integrated with and/or attached to one or more support members. In some embodiments, the entire microfluidic device 1000 or any component thereof can be made by molding or 3-D printing. In some embodiments, the microcapillaries (1010, 1070) and reaction chamber 1050 are formed from an absence of support substrate material. In other words the support substrate can be the walls of the first and second microcapillaries (1010, 1070) and reaction chamber 1050.

The shape of the reaction chamber 1050 can be any suitable shape, so long as the diameter or width ($w_{rc}$), as is applicable, is different than that of the first microcapillary 1010. In some aspects, the diameter or width ($w_{rc}$), as is applicable, of the reaction chamber 1050 is greater than the diameter or width ($w_{fm}$) of the first microcapillary 1010. The shape of the reaction chamber 1050 can be regular or irregular. The shape of the reaction chamber 1050 can be any three dimensional shape. In some aspects, the shape of the reaction chamber can be substantially spherical, ellipsoid (regular or irregular), or ovoid (regular or irregular).

The second microcapillary 1070 can allow for gas collection and measurement of fluid displacement by gas collected in the second microcapillary 1070. The serpentine region 1080 of the second microcapillary 1070 can increase the total length (and thus volume) of the second microcapillary 1070 to allow enough reactants to make a sufficient volume of gas to be generated to allow for visualization and simple measurement while still keeping the total device size low. The serpentine region 1080 can be composed of a serpentine with two or more turns. The microfluidic device 1010 shown in FIG. 1 has a serpentine region 1080 with two turns.

The microcapillaries (1010, 1070) can be any suitable shape (including but not limited to round, elliptical, square, rectangular, and/or triangular). The microcapillaries (1010, 1070) can be made to have any diameter or width, as is applicable, so long as a continuous region of gas is supported (such as by surface tension) in the second microcapillary 1070. At some point (depending on the reactant(s) used and gas produced, inter alia) the microcapillaries can be too large and drops of liquid reactants can adhere to the walls randomly, which can lead to a disrupted gas region in the second microcapillary 1070. Also, in some aspects, the use of smaller microcapillaries reduces the cost of making and using the microfluidic device, which can be advantageous for classroom settings. However, there is a limit to how small the microcapillaries can be. At some point (depending on the reagents used and gas produced, inter alia) the force required to drive fluids through the channels will be unreasonably large and the method of fabricating the small channels will be more difficult, and the error produced from small variations in the amount of reagents used will become so great that it is difficult to obtain an accurate measurement of gas formation. In other words, it is more difficult to accurately measure small volumes of reagents used, which can introduce too much variation in the system for it to work accurately. Further, at some point the color of the reagents used becomes so faint when extremely small volumes are used that it is impractical to measure gas formation by displacement of the colored reactant by the naked eye due to a lack of contrast with the gas in the microcapillary.

The microfluidic device 1000 can be configured to hold any volume of reactant(s) and/or gas. In some aspects, the volume of the first microcapillary 1010 can be less than the volume of the second microcapillary 1070. In some aspects, the volume of the reaction chamber can be less than the volume of the first microcapillary 1010 and/or the second microcapillary 1070. The first microcapillary 1010 can range in volume from about 0.04 to about 4 mL or more, including any value or range therein. The first microcapillary 1010 of microfluidic device shown in FIG. 1 has a volume of about 0.1 mL. The second microcapillary 1070 can range in volume from about 0.04 to about 4 mL or more, including any value or range therein. The second microcapillary 1070 of microfluidic device 1000 shown in FIG. 1 has a volume of about 0.3 mL. The reaction chamber of microfluidic device 1000 shown in FIG. 1 has a volume of about 0.04 mL. The third microcapillary can range in volume from about 0.04 mL to about 4 mL or more, including any value or range therein. The total volume of the microfluidic device can be based on the theoretical amount of gas that can be generated from the reactants based on known scientific equations (e.g. the Ideal Gas Law). Thus, the actual volume of the microfluidic device 1000 is important only as it relates to the amount of reactants used and amount of gas produced. As discussed above there are some practical limitations on the size of the microcapillaries, which can impact the actual volume of the microfluidic device.

In some aspects the microfluidic device 1000 can be configured such that the microcapillaries (1010, 1070) and reaction chamber 1050 can hold a volume of reactant(s) and/or gas of less than 10, 9, 8, 7, 6, 5, 4, 3, 2, 1 mL or cc. In some aspects, it can be desirable for the device to be hand held. Thus, in some aspects the microfluidic device 1000 can be configured such that the microcapillaries (1010, 1070) and reaction chamber 1050 can hold a volume of reactant(s) and/or gas of less than 10, 9, 8, 7, 6, 5, 4, 3, 2, 1 mL or cc. In some aspects, the total volume of the first microcapillary 1010, second microcapillary 1070, and the reaction chamber 1050 can range from about 0.25 mL to about 10 mL.

In some aspects, it can be desirable for the microfluidic device 1000 to be larger, such as in settings where groups of people may be viewing a demonstration (e.g. a museum or large lecture). Thus, it can be desirable that the changes occurring due to the reaction in the microfluidic device 1000 can be visually observed from a greater distance than would be used if the microfluidic device were handheld. Thus, the microfluidic device 1000 and its components (e.g. the microcapillaries and reaction chamber) can be made to hold larger volumes. In some aspects, the microfluidic device 1000 can be configured such that the microcapillaries (1010, 1070) and reaction chamber 1050 can hold a volume of reactant(s) and/or gas of greater than 10, 50, 100, 1000, 2000, 3000, 4000, 5000, 6000, 7000, 8000, 9000 10,000 microliters or more. In some aspects, the total volume of the first microcapillary 1010, second microcapillary 1070, and the reaction chamber 1050 can range from about 10 microliters to 10 milliliters or more.

The inlet 1020 of the first microcapillary 1010 can be configured to receive a pipette tip, tube, needle, syringe, or other apparatus or device that can deliver a reagent to the first microcapillary 1010. The first microcapillary 1010 can be substantially straight between the inlet 1020 and the end region having the hook shape 1030.

The microfluidic device 1000 can be made by any suitable method including, but not limited to, molding, (including, but not limited to, replica and injection-molding), casting, imprinting, compounding, lamination, extrusion, 3-D printing, wet etching, reactive ion etching, photolithography, soft lithography, laser ablation, hot embossing, micromachining, and combinations thereof.

Methods of Using the Microfluidic Devices

Also described herein are methods of using the microfluidic devices 1000 described herein. The microfluidic devices 1000 can be used, for example, as instructional tools for demonstrating scientific principles, such as the Ideal Gas Law, stoichiometry, and/or limiting reagents. In some embodiments, the method of using the microfluidic device 1000 can include the steps of delivering a first reagent to the microfluidic device through the inlet 1020 of the first microcapillary 1010 until it fills the first microcapillary 1010, the reaction chamber 1050, and the second microcapillary 1070. The method can include the step of delivering a second reagent to the microfluidic device 1000 through the inlet 1020 of the first microcapillary 1010; delivering a third reagent to the microfluidic device 1000 through the inlet 1020 of the first microcapillary 1010; and plugging or sealing the first microcapillary 1010 such that the reagents present in the first microcapillary 1010 are moved into at least the reaction chamber 1050. For example, in some aspects the first reagent can be seltzer water, baking soda (or vinegar) can be the second reagent and vinegar (or baking soda) can be the third reagent. In some embodiments, the first and second reagents are mixed prior to delivering to the microfluidic device 1000 and are delivered together as a single solution. In other words, the steps of adding the first and second reagents can occur simultaneously when they are delivered as a pre-mixed solution. In some embodiments, the first reagent and the second reagent, the second and the third reagent, or the first reagent, second reagent, and the third reagent can be delivered simultaneously. In some embodiments, each reagent can be delivered separately. It will be appreciated that different reaction combinations can include more than three reagents. These are also within the scope of this disclosure.

The method can further include the step of incubating reagents within the microfluidic device 1000 for a period of time. The time can range from about 10 seconds to 10 minutes or more. The incubation time will depend on, inter alia, the reaction being completed in the microfluidic device 1000 and the amount of reagents included. One of ordinary skill in the art will be able to calculate the appropriate amount of time based on their knowledge of the reaction being completed. In some embodiments, the step of quantifying the amount of gas formed by measuring the displacement of the first reagent in the second microcapillary 1070.

In some embodiments, it is desirable to visually see displacement of one of the liquid reagents during and/or upon reaction completion by a gas and/or other liquid produced during a reaction. Thus in some embodiments, one or more of the reagents can be dyed with a color producing compound. The color producing compound can be any compound that will add a pigment to at least one of the liquid reagents. The color producing compound can be non-toxic or one that is generally recognized as safe. In some embodiments, the color producing compound can be a food coloring that is commercially available. In some embodiments, the first reagent is dyed with a color producing compound.

Any suitable reaction can be carried out in the microfluidic device. The reaction and reagents being used can vary depending on, inter alia, the scientific principle being demonstrated, availability of reagents, and student age or level. In some embodiments, the reaction can be as follows:

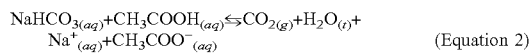
(Equation 2)

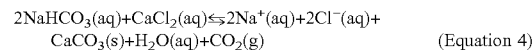
(Equation 4)

The reagents used can be any suitable reagents based on at least the reaction being conducted. The reagent(s) can be commercially available, house-hold ingredients. The reagent(s) can be non-toxic and/or generally recognized as safe. The first reagent can be used to pre-fill the microfluidic device 1000 with liquid that is saturated with carbon dioxide. If the liquid is not saturated with carbon dioxide, then it can solvate some of the carbon dioxide generated by the reaction, which can, in some aspects, prevent the user to accurately quantify the amount of carbon dioxide gas that is generated. In some embodiments, the first reagent can be seltzer water, sparkling water, or any other carbonated liquid that does not contain additional components that will not interfere with the desired reaction being performed in the device. In some embodiments, the second reagent can be a reactant as set forth in Equation 2, such as acetic acid, which can be dissolved in carbonated water, sodium bicarbonate, which can be in carbonated water, or solid sodium bicarbonate. In some embodiments, the second reagent can be one of the reactants in Equation 4, such as calcium chloride, which can be dissolved in carbonated water, sodium bicarbonate, which can be dissolved in carbonated water, solid calcium chloride, or solid sodium bicarbonate. In some embodiments, the third reagent can be acetic acid, calcium carbonate, or sodium carbonate dissolved in carbonated water.

The reagents can be delivered to the microfluidic device 1000 by any device or other methods. Suitable devices include, syringes, droppers, pipettes (e.g. disposable, automatic, and micro-pipettetes), pumps, and funnels. Other delivery methods will be appreciated by those of ordinary skill in the art in view of the description herein and are within the scope of this description.

The methods described herein can provide a low-cost, safe, and simple demonstration of scientific principles that are typically difficult for students to conceptually grasp. These personalized experiments can enhance the learning experience for students in most academic and other settings as special laboratory equipment is not required.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Example 1

Stoichiometry, limiting reagents, and the Ideal Gas Law are concepts that are typically difficult for most students to comprehend using traditional book and lecture methods of teaching. Anatomy models, physics science kits, and chemistry science kits have been developed to provide a hands-on interactive approach to learning various topics within these subjects. However, there are limited teaching tools available that provide students with the equivalent modality of learning for stoichiometry, limiting reagents, and the Ideal Gas Law. As such, there exists a need for a hands-on cost efficient, safe, and effective method to teach difficult concepts to students, such as stoichiometry, limiting reagents, and the Ideal Gas Law. This Example can demonstrate a microfluidic device, its fabrication, and use for demonstrating scientific principles such as stoichiometry, limiting reagents, and/or the Ideal Gas Law.

The microfluidic device in this Example is a hands-on, polydimethylsiloxane (PDMS) microfluidic device that can be used to enable students to visually conceptualize stoichiometry, limiting reagents and/or the Ideal Gas Law. The microfluidic device was created using inexpensive materials making it cost-effective for use in middle and high school classrooms. The microfluidic device was made from microscope slides for use as seals, enclosures at the base of the microfluidic device. A glass pipette rod was used to mold the inlet microcapillary. During use, this pipette rod was also used as a plug as described in greater detail below. A serpentine shaped glass rod was used as to mold the serpentine microcapillary. A glass disk (FIG. 2 and FIG. 3) or a ball of wax coated string (FIG. 10) was used to mold the reaction chamber. These components were attached to the microscope slides for casting as is described in greater detail below. Some other materials were employed to make the mold to cast the microfluidic device. The microfluidic device had an inlet for entry of reagents into the microcapillary of the microfluidic device.

Once the microfluidic device was assembled and ready for use, reagents were added to the device and a reaction was allowed to occur. Briefly, an acetic acid and seltzer water solution containing blue food coloring was deposited into the microcapillary of the device similar to that shown in FIG. 6. Sodium bicarbonate and seltzer water solution was then inserted into the inlet and pushed through such that it reached the reaction chamber of the microfluidic device similar to that shown in FIGS. 7A-7B and 8. The channel was sealed and the reaction was allowed to occur. Gas generated from the reaction displaced the colored liquid in the microcapillary in the serpentine region, which allows for visualization of the underlying scientific principle similar to that shown in FIGS. 9A-9C.

Example 2

Introduction

Figure 4:
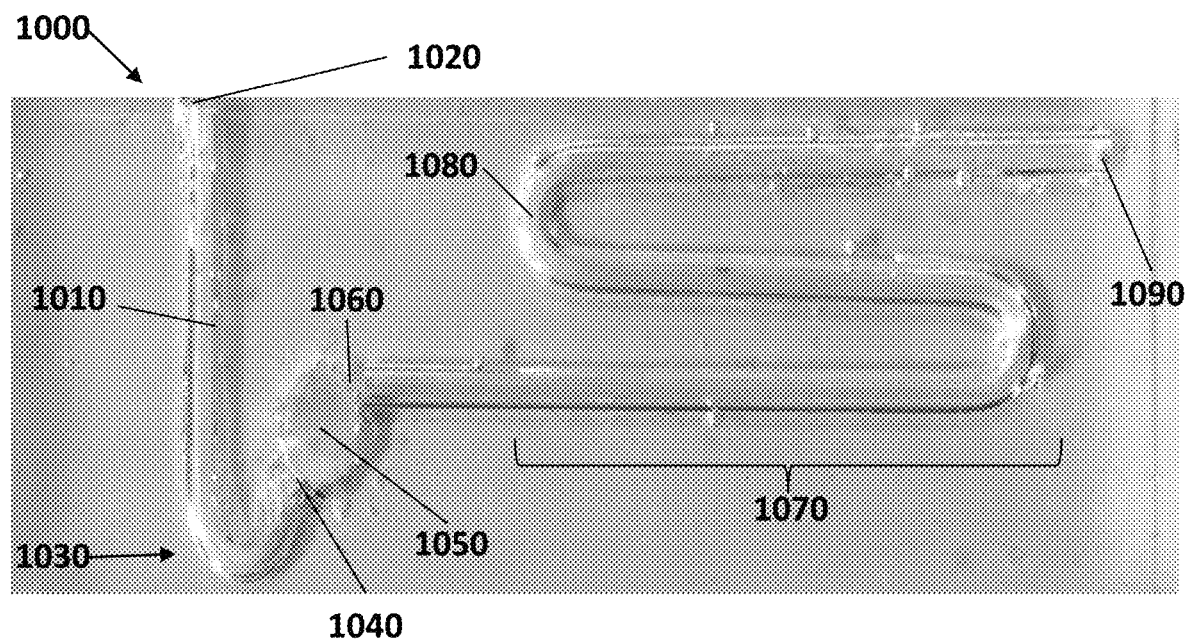
FIG. 4 shows an image of an embodiment of a finished microfluidic device after being removed and separated from the mold and cleaned with, e.g. isopropyl alcohol and ready for use.

This Example can demonstrate a microfluidic device and its application to illustrate fundamental scientific principles. Through the use of common household items, including, but not limited to, baking soda and vinegar, concepts such as stoichiometry, limiting reagents, and the ideal gas law can be introduced and/or reinforced via a hand-held microfluidic device as shown in FIG. 4.

Stoichiometry can be conceptualized using the microfluidic device described herein. Stoichiometry is used when balancing the chemical reaction taking place inside the microfluidic device. It also allows for relation of the consumption of reactants to the formation of products. Furthermore, the limiting reagent determines the species that the reaction is dependent upon. Finally, from the volume of the liquid displaced, the amount of $CO_2$ or other gas generated by the reaction can be quantified using the ideal gas equation. (Equation 1).

$$PV=nRT \qquad \text{(Equation 1)}$$

By rearranging the equation and solving for moles, n, the ideal gas law yields the amount of carbon dioxide produced to determine whether the experiment was successful.

In addition to its ability to be utilized in the classroom, the microfluidic device created is safe enough that it can be used at home. Due to its safe and cost effective nature the microfluidic chip proves to be an efficient way to illustrate stoichiometry, the limiting reagent and the ideal gas law, inside or outside of a classroom.

Methods

Figure 2:
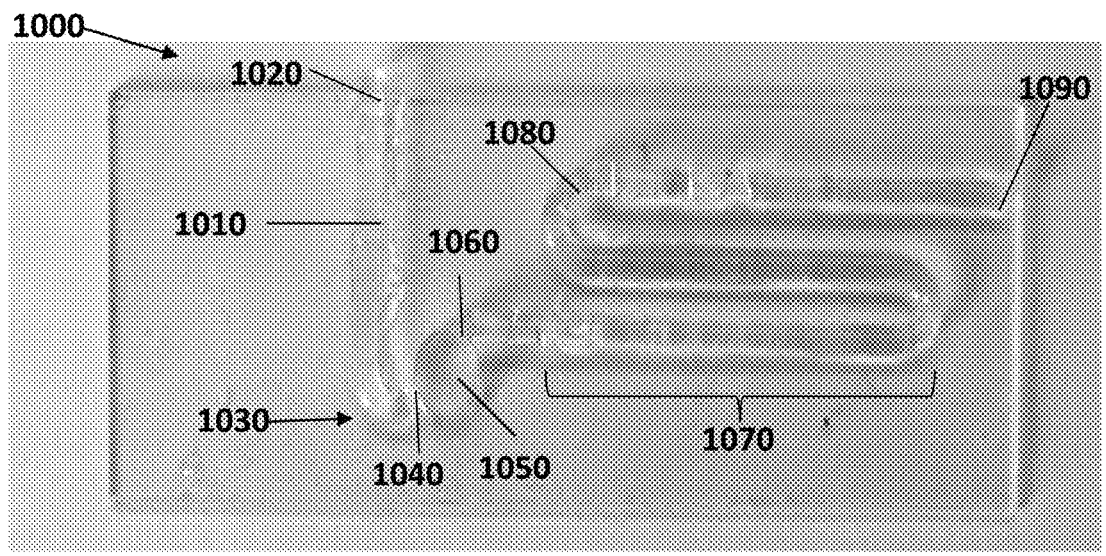
FIG. 2 shows an image demonstrating an embodiment of a mold used to form the microfluidic device shown in FIG. 1.
Figure 3:
FIG. 3 shows an image of the mold of FIG. 2 placed in a container for casting of the microfluidic device shown in FIG. 1. A material can be poured into the mold, such as PDMS, and allowed to dry or cure.
Figure 5:
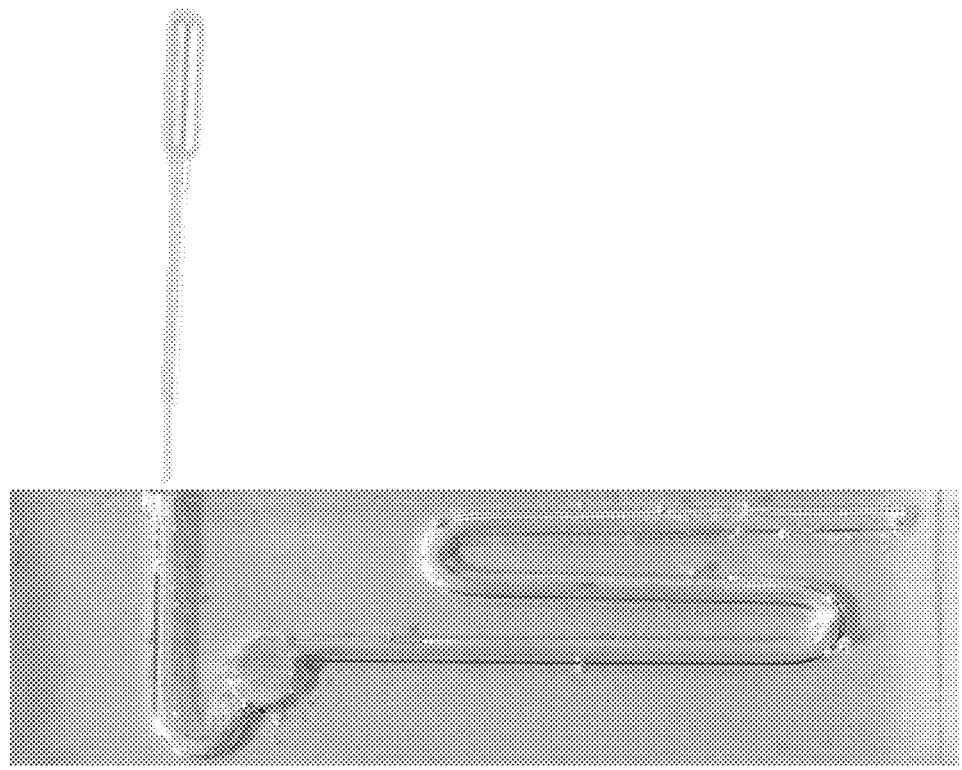
FIG. 5 shows an image of the finished microfluidic device of FIG. 4 with a pipettete or other fluid or gas dispenser demonstrating where fluid or gas can be added to the inlet of the microfluidic device when in use.

Microfluidic Device Fabrication. To create the microfluidic device, a mold was generated and cast. The mold consists of a three glass pieces fixed onto a microscope slide (FIG. 2). To cast the mold, it was formed into a box with an open top secured with duct tape (FIG. 3). A suitable material, in this case poly(dimethylsiloxane) (PDMS) was used to construct the microfluidic device. The PDMS was poured into the mold. The mold was then placed in an oven and allowed to cure at about 100° C. for about 35 minutes. Once cured, the microfluidic device was separated from the mold and cleaned for use using a suitable solvent, such as isopropyl alcohol. The final product is shown in FIG. 5 with a pipette directed to the inlet of the microfluidic device.

For the microfluidic device shown in e.g. FIG. 4, the hook region can hold a volume of about 0.1 mL, the reaction chamber (circular or round portion) can hold a volume of about 0.040 mL, and the serpentine portion can hold about 0.340 mL. For this specific microfluidic device, the gas volume chosen should be less than 0.340 mL (e.g. 0.3 mL) such that it can be measured. If gas is allowed to exit the device, such as if the gas volume were greater than the volume of the serpentine region, the user will not know the total volume of gas produced. The device volume for this Example is based on the theoretical amount of gas that is generated from calculations of the ideal gas law and the moles of sodium bicarbonate and acetic that are used are based on these calculations for this Example. Insofar as the volumes are only relevant to determining how much reagents should be used to generate a specified volume of gas (e.g. carbon dioxide in this Example). As such, these volumes can change and the microcapillaries and reaction chamber can be made of any desired size and volume.

Use of the Microfluidic Device

Figure 6:
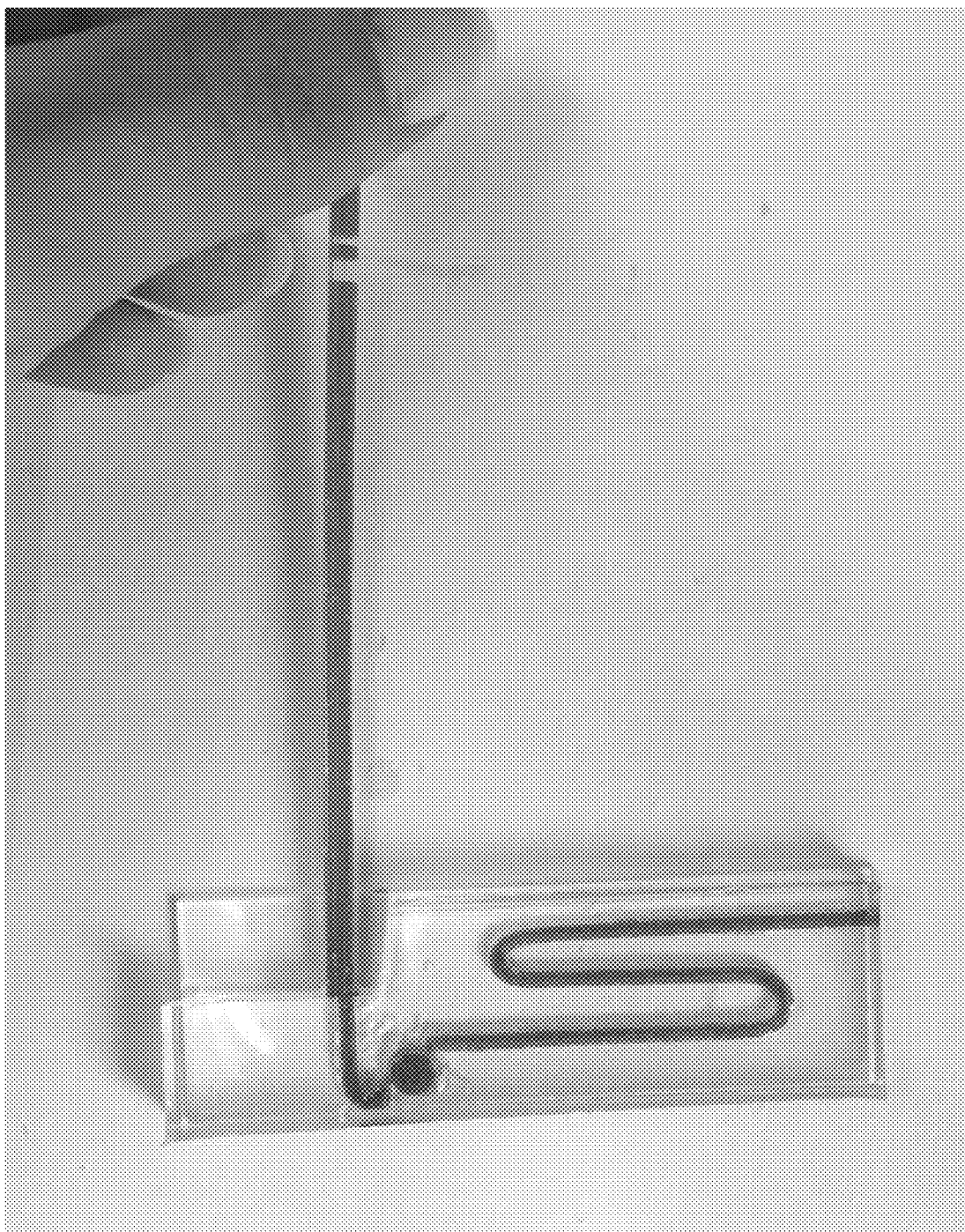
FIG. 6 shows an image of an embodiment of the microfluidic device in use to demonstrate a limiting reagent by first being filled with a first reagent (e.g. a colored fluid such as blue sparkling water).
Figure 7A:
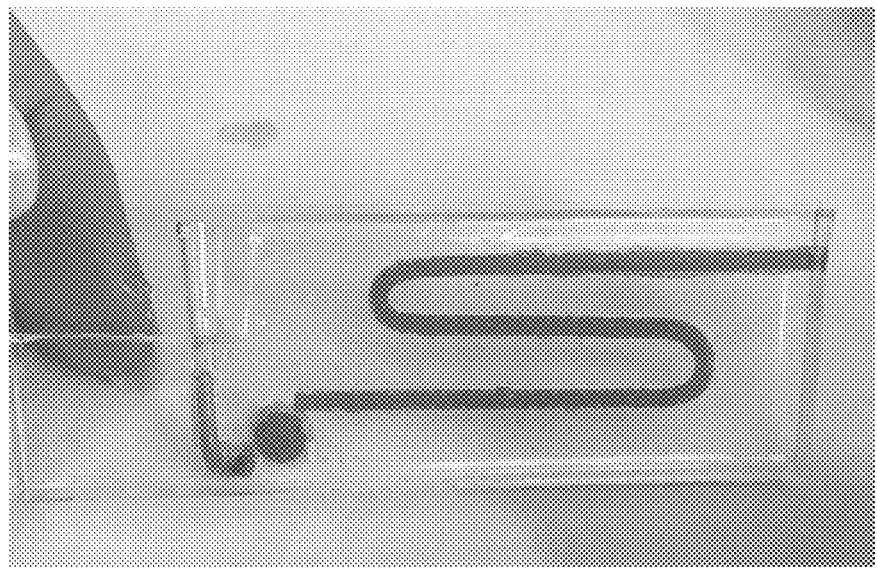
FIGS. 7A-7B show images demonstrating delivery of a second reagent (e.g. a limiting reagent) to the microfluidic device using a calibrated portion of a pipette.
Figure 7B:
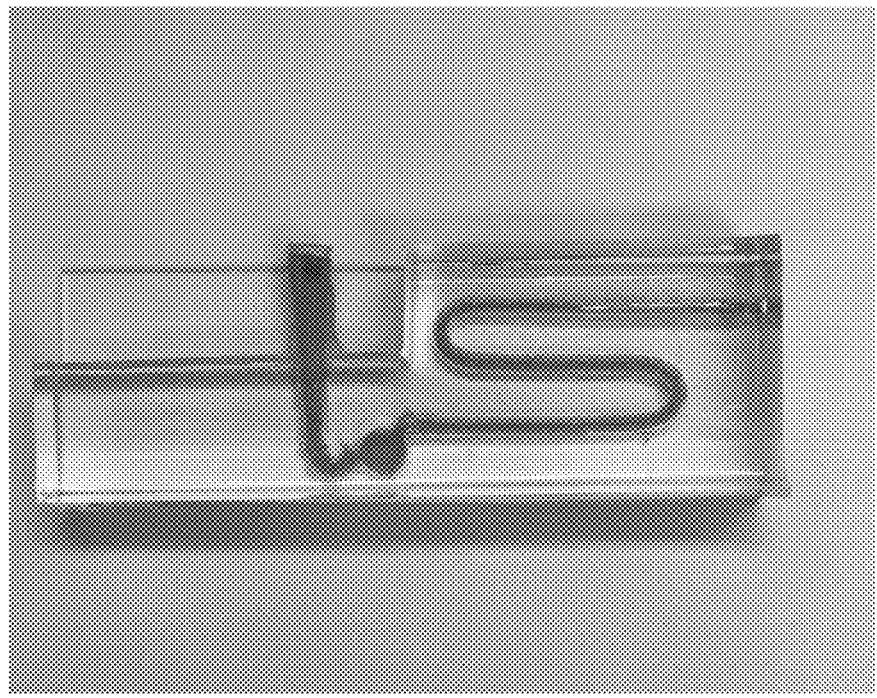
Figure 8:
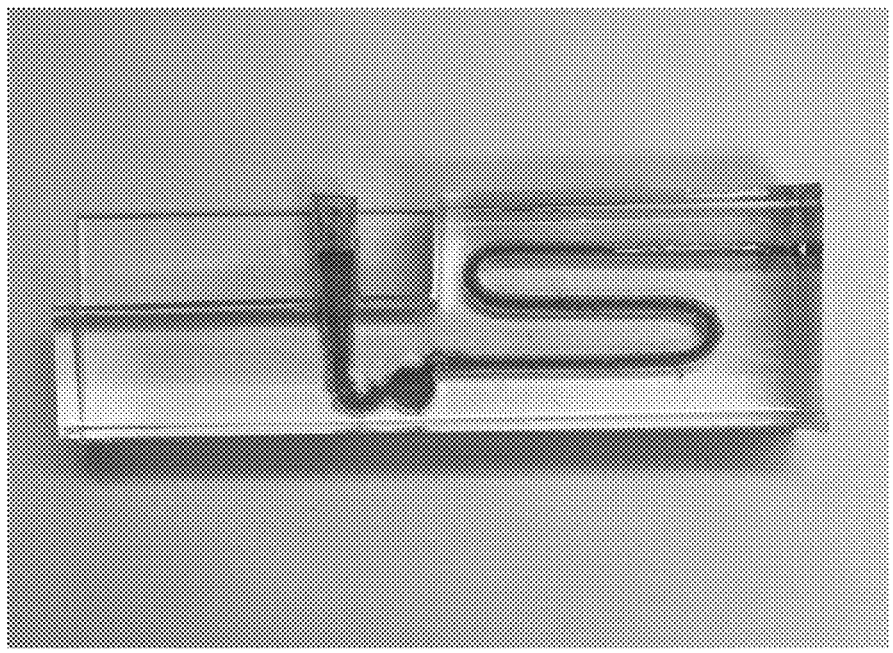
FIG. 8 show images demonstrating delivery of a third reagent (e.g. an excess reagent) to the microfluidic device. After addition of the excess reagent, the microfluidic device is locked and sealed at the inlet.
Figure 9A:
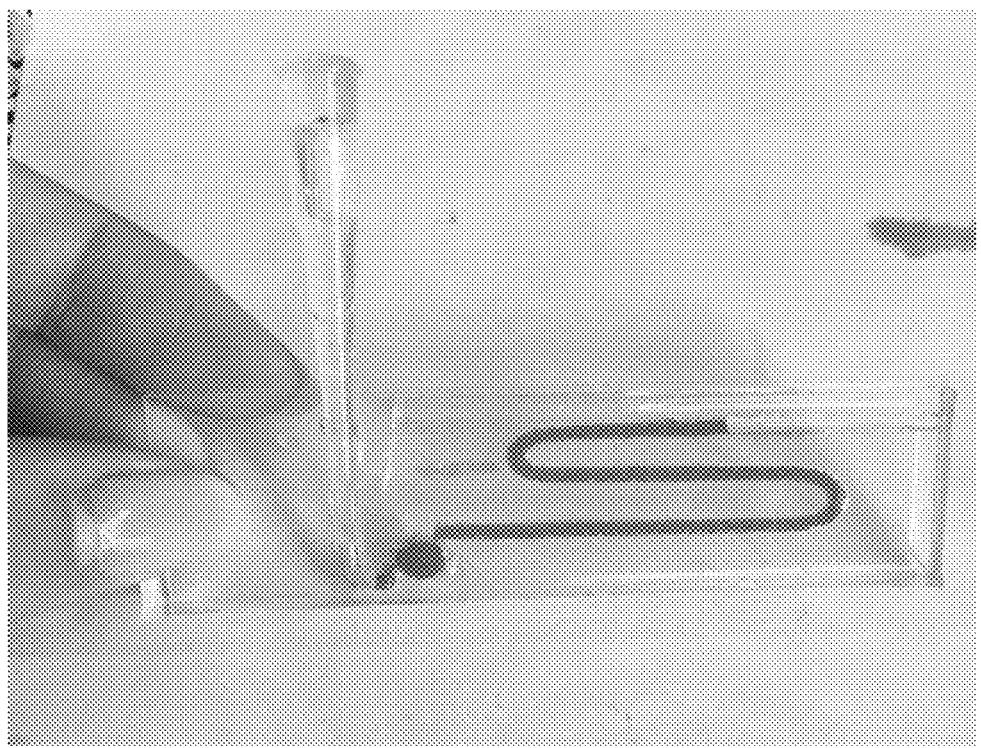
FIGS. 9A-9C show images of the microfluidic device that demonstrates gas displacement of the colored reagent upon reaction of the reagents present in the microfluidic device.
Figure 9B:
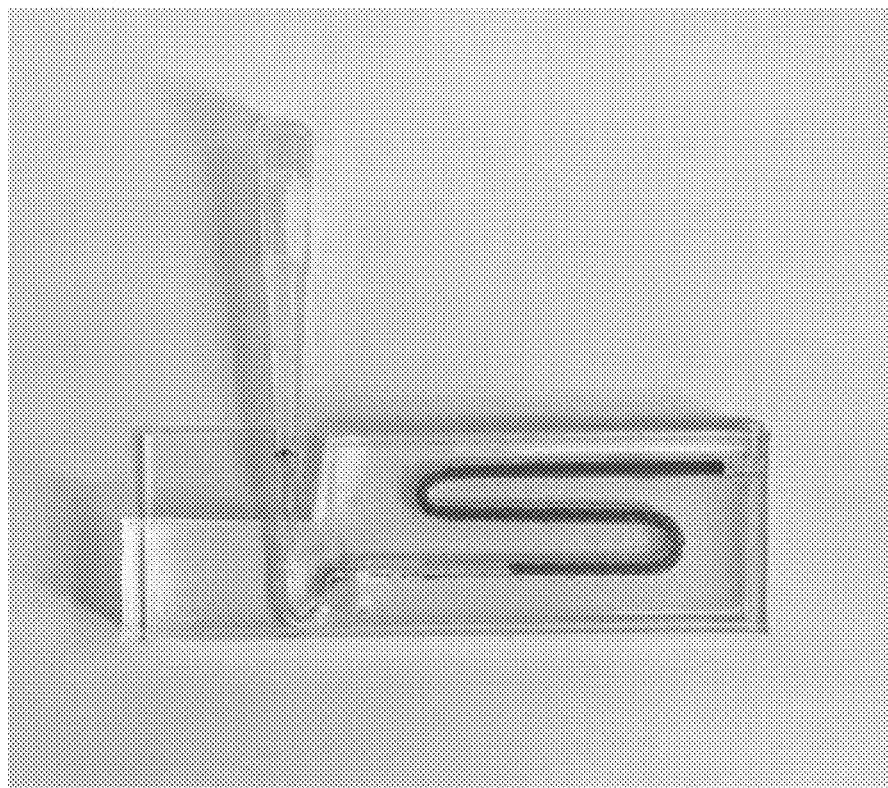
Figure 9C:
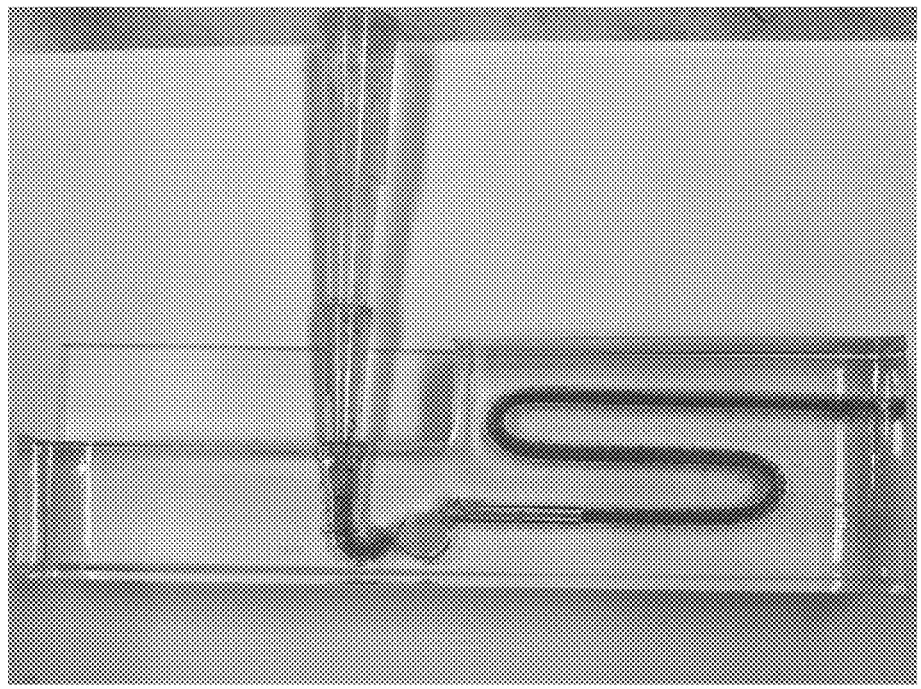

The microfluidic device was filled via its inlet with sparkling water that was colored blue using food coloring (FIG. 6). The limiting reagent, acetic acid, was inserted in the inlet of the microfluidic device in a predetermined volume of 40 μL, using a calibrated portion of a pipette (FIGS. 7A-7B). 1.02 mg of the reagent, sodium bicarbonate was then added (FIG. 8). To lock the seal the chip and ensure reaction, a pipette tip filled with epoxy is used to push the reagent in and seal the entry channel (FIGS. 9A-9C). Upon reaction between the sodium bicarbonate and acetic acid, the generated carbon dioxide gas displaced the liquid (FIGS. 9A-9C).

Discussion

The reaction utilized in the microfluidic device in this Example was acetic acid and sodium bicarbonate:

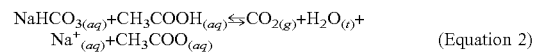
$$NaHCO_{3(aq)}+CH_3COOH_{(aq)} \leftrightarrows CO_{2(g)}+H_2O_{(l)}+ \\ Na^+_{(aq)}+CH_3COO_{(aq)} \qquad \text{(Equation 2)}$$

Using the ideal gas and the desired volume of gas, the moles of carbon dixoide gas can be quantified. This can be done by marking the microfluidic device the end(s) of the colored fluid portion and measuring the distance. Using the known volume and the distance of displacement, the amount of the gas generated can be calculated. The gas volume chosen is based upon the volume of the serpentine region and the circular reaction chamber being 340 μL. To ensure the gas generated can be quantified, a volume less than 340

μL should be chosen; in this case 300 μL. Solving the ideal gas law equation, the moles generated can be determined.

$$n = \frac{PV}{RT} = \frac{(1.00 \text{ atm})(3.0 \times 10^{-4} \text{ L})}{\left(0.0821 \frac{\text{atm} * \text{L}}{\text{mol} * \text{K}}\right)(300 \text{ K})} = 1.22 \times 10^{-5} \text{ mol} \quad \text{(Equation 3)}$$

From the moles of carbon dioxide generated, the concentrations of sodium bicarbonate and acetic acid needed to produce the gas can be determined by using stoichiometry.

| | | |
|---|---|---|
| $1.22 \times 10^{-5}$ mol $CO_2$ | 1 mol | 84.007 g = |
| $NaHCO^3$ | $NaHCO_3$ | $1.02 \times 10^{-3}$ g or 1.02 mg $NaHCO_3$ |
| | 1 mol $CO_2$ | 1 mol $NaHCO_3$ |
| $1.22 \times 10^{-5}$ mol $CO_2$ | 1 mol $CH_3COOH$ | 60.05 g = $0.733 \times 10^{-3}$ g or 0.733 mg $CH_3COOH$ |
| | 1 mol $CO_2$ | 1 mol $CH_3COOH$ |

The concentration of the vinegar solution to be used in the reaction can be determined from the moles of gas and the concentration of food grade vinegar. The concentration of food grade vinegar (e.g. household vinegar) is approximately 0.833 M. Therefore, the concentration of the vinegar solution can be found through the following calculations.

$$[CH_3COOH] = \frac{1.22 \times 10^{-5} \text{ moles}}{40 \times 10^{-6} \text{ L}}$$

$$[CH_3COOH] = 0.31 M$$

Therefore, a 1:2.7 dilution of the vinegar must be performed in order to achieve the desired volume of $CO_2$. With the dilution factor of 2.7 and the baking soda being a concentration of 1.02 mg in 0.04 mL (0.31 M), the reaction can be performed. However, it is important to note that all measurements were based upon the chosen volume of 300 μL, which is variable. The calculated values are subject to change following the alteration of the desired amount of carbon dioxide gas. Additionally, alternative reactions can be carried within the microfluidic device. An additional reaction is the reaction between sodium bicarbonate and calcium chloride.

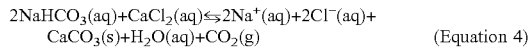

$2NaHCO_3(aq)+CaCl_2(aq) \leftrightarrows 2Na^+(aq)+2Cl^-(aq)+$
$\quad CaCO_3(s)+H_2O(aq)+CO_2(g)$ (Equation 4)

The same application and use applies with the additional reaction utilized in the microfluidic device.

Furthermore, alternate designs were explored but the current design was optimal. The hook shape for the entry channel was chosen to prevent bubbles upon the addition of liquid into the chip, as well as to avoid backflow of liquid due to the generation of carbon dioxide. The serpentine shape was chosen to enhance viewing and measuring of the liquid displacement. Finally, the circular or round reaction chamber was chosen to ensure the gas generated would flow upwards into the serpentine pieces to avoid backflow into the entry channel. It is important to note that the height of the circular reaction chamber is about equivalent to the height of the serpentine piece; this design feature ensures the gas will push the liquid through the serpentine piece, rather than getting stuck in the circular portion. Finally, the pipette tips used as plugs are ensure the gas does not escape through the entry channel and the desired outcome is observed.

Example 3

Stoichiometry, limiting reagents, and the Ideal Gas Law are difficult topics for students (e.g. middle and high school) to conceptualize and thus difficult for teachers to teach. There are limited activities currently available that provide a hands-on way for students to see the ratio in which chemical reactions take place. The experiment and device in this Example can be completed in a short amount of time (minutes) at a low cost (e.g. less than about five dollars). Further, food-grade materials were employed, thus the experiment does not have safety concerns.

The microfluidic device demonstrated in this Example was inexpensive, disposable, and hand-held. The small size can have the advantage of reducing the amount of reagents needed to run the experiments and can reduce the waste and cost of the performing the experiment. The inner diameter of the microcapillaries of the device can be measured and thus the microfluidic device demonstrated can be utilized to measure various levels of gas as opposed to only one.

Figure 10:
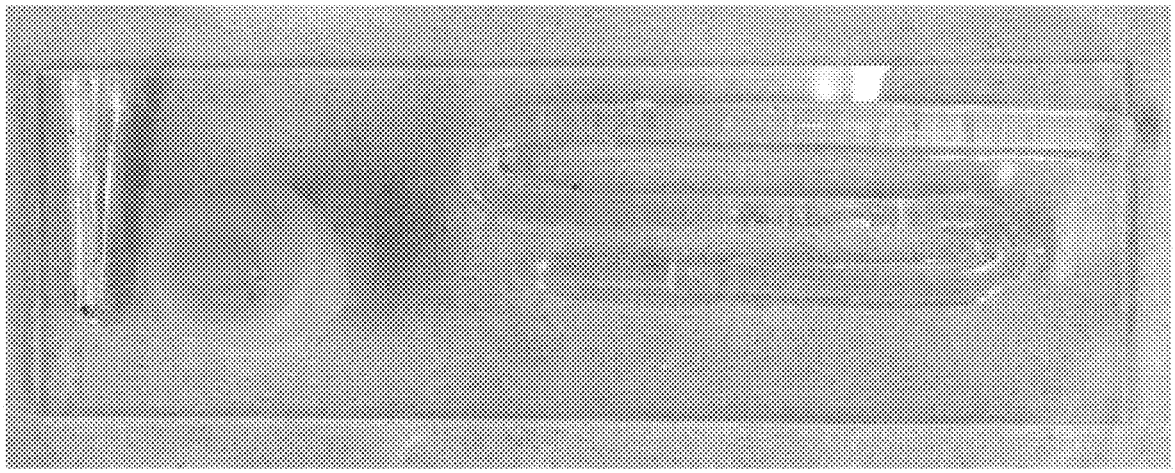
FIG. 10 shows an image of an embodiment of a mold set up prior to casting in PDMS.
Figure 11:
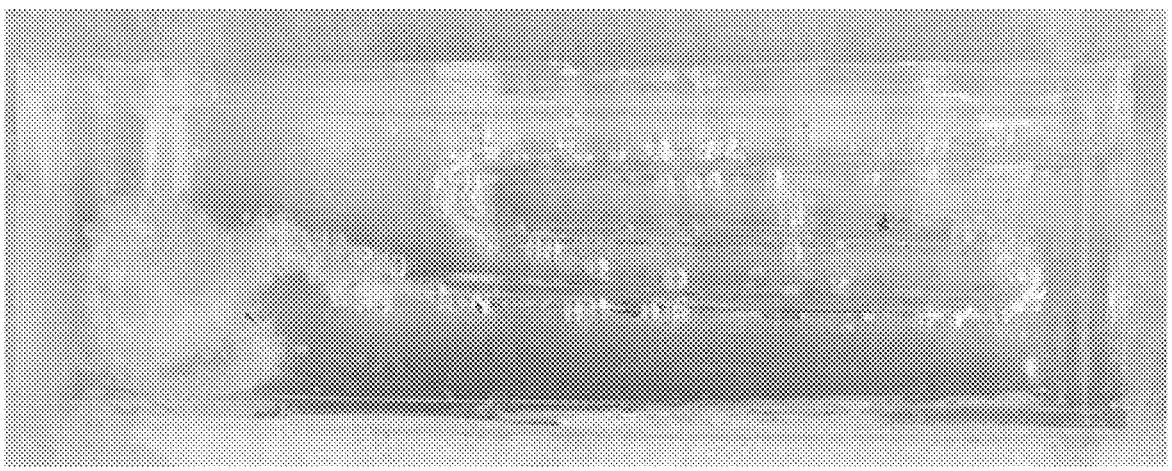
FIG. 11 shows an image of an embodiment of a microfluidic device as described herein using the molds shown in FIG. 10 after casting in PDMS.
Figure 12A:
FIGS. 12A-12E show the microfluidic device of FIG. 11 in use.
Figure 12B:
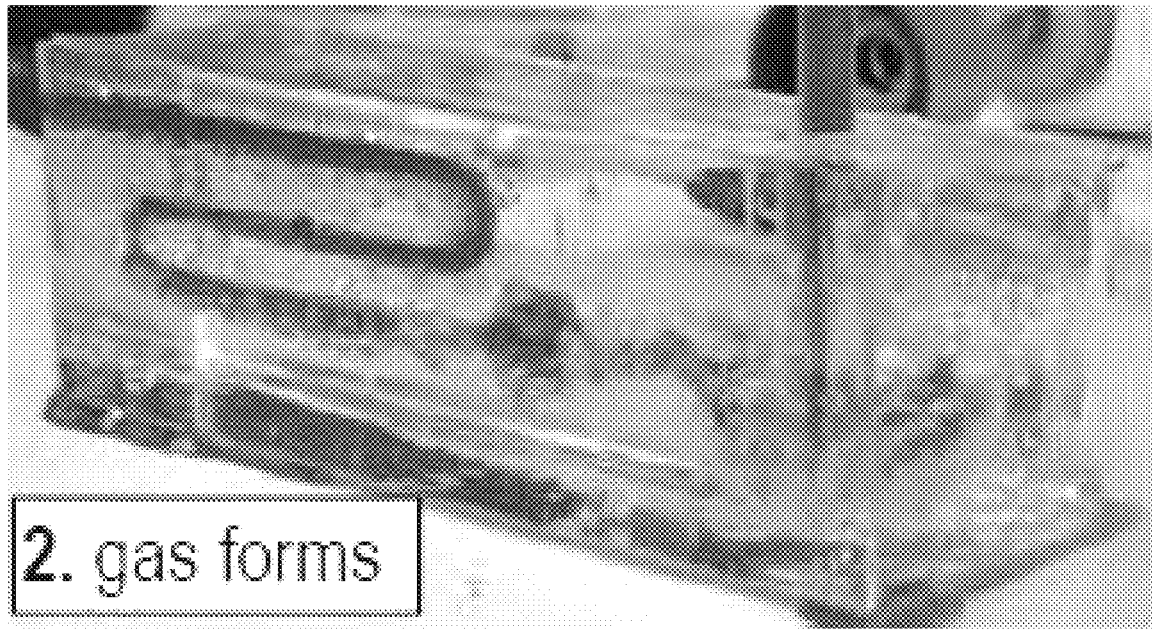
Figure 12C:
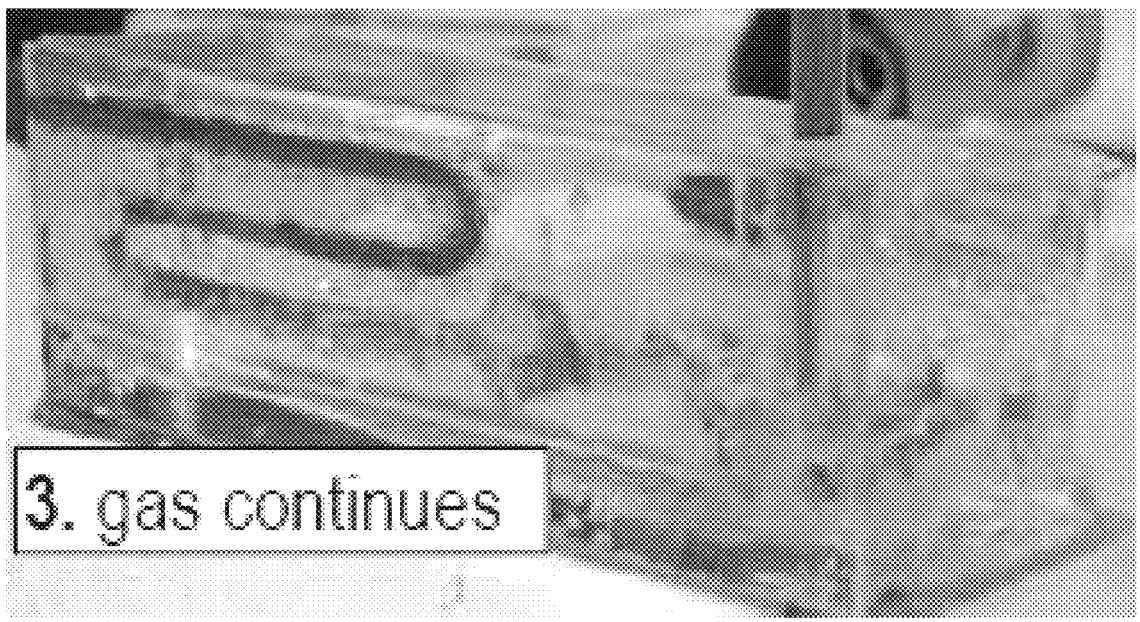
Figure 12D:
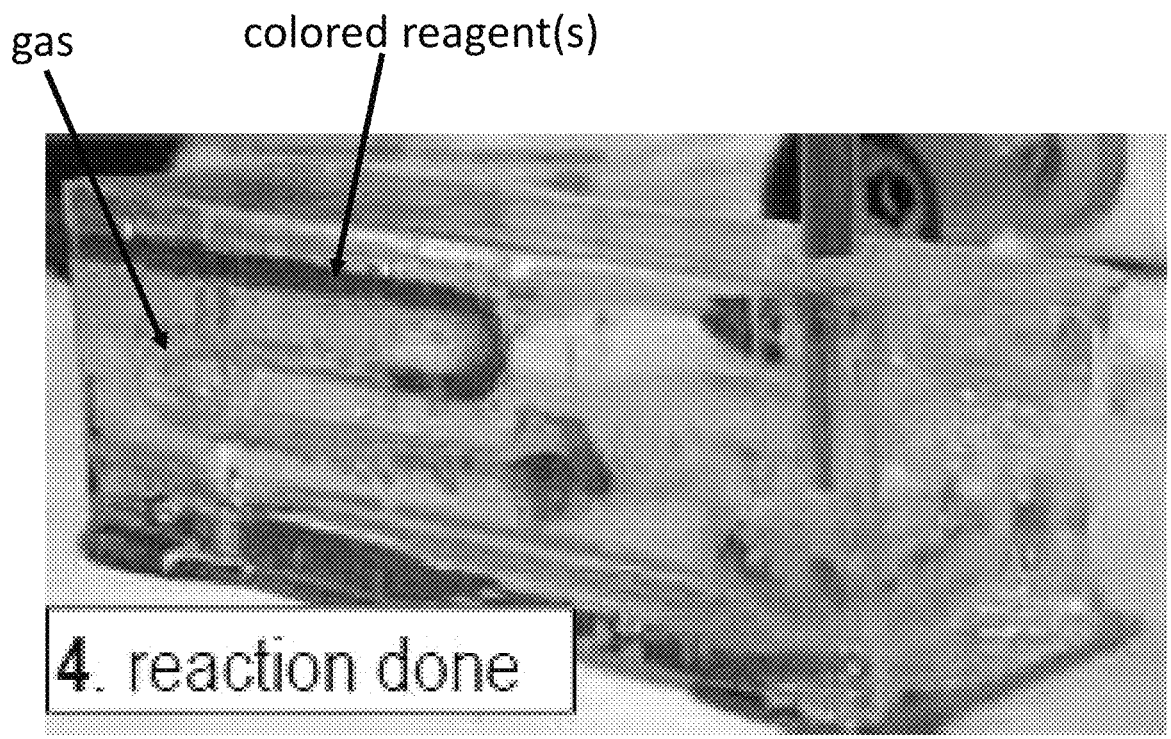
Figure 12E:
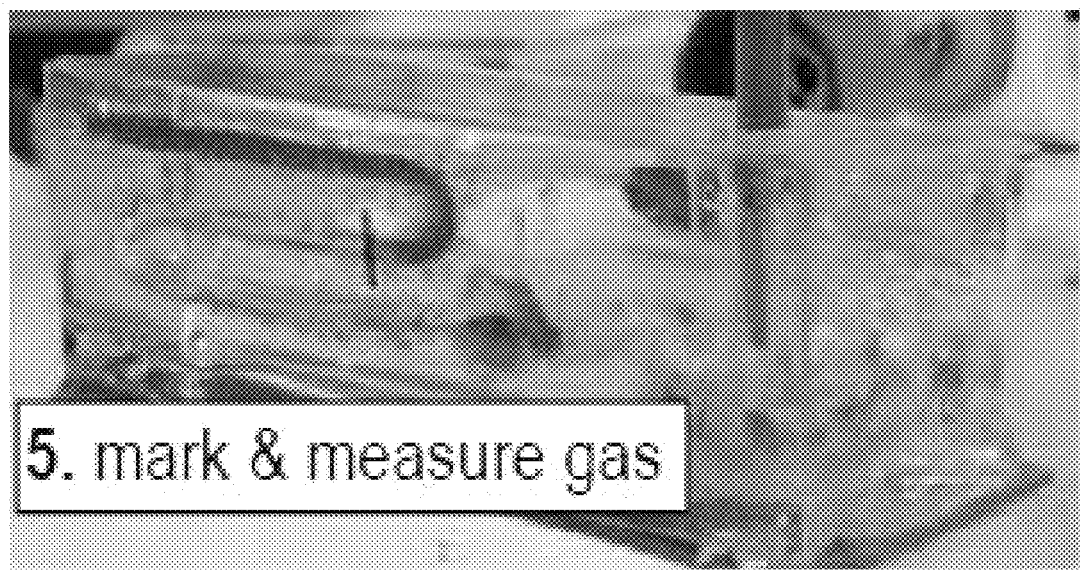

FIGS. 10-12E shows images demonstrating the fabrication and use of a microfluidic device when it is fabricated using a ball of wax instead of a glass disk. The images of the device shown in FIGS. 1-9 were made using a glass disc as opposed to the method described here. FIG. 10 shows an image of an embodiment of a mold set up prior to casting in PDMS. The mold was generated by gluing pieces of glass or wax in the desired shape of the various microcapillaries and reaction chamber to a microscope slide. The three pieces were connected using a thin piece of soldering wire; the wire was wrapped around both ends of the wax ball mold for the reaction chamber and then tethered to the serpentine glass piece and threaded through the entry channel formed from a pipette tip. Four microscope slides were used to enclose the bottom slide that served as a support for the mold pieces on all sides. The top was left open to allow for a casting polymer (e.g. PDMS) to be poured into the mold. The mold was cast in PDMS and placed into an oven to cure at about 50° C. for about 5 hours. Once cured, the microfluidic device was removed from the mold by peeling off the glass leaving all the glued pieces secured to the glass. The wax was removed by pulling out the soldering wire. FIG. 11 shows an image of an embodiment of a microfluidic device as described herein using the molds shown in FIG. 10 after casting in PDMS. To use the microfluidic device, it was placed on a microscope slide to seal any holes from peeling the cast microfluidic device from the glass molding slide. To ensure an effective seal between the glass microscope slide and the PDMS, the microfluidic device and glass microscope slide it was placed on was wiped down with isopropyl alcohol. The microfluidic device was lined up on the microscope slide to ensure there is no leaks during the reaction. FIGS. 12A-12B show the microfluidic device of FIG. 11 in use. To use the microfluidic device, acetic acid (vinegar) and seltzer water solution was made and dyed with food coloring. The mixture was then used to fill the microfluidic device. A pipette was used to deliver the solution. The pipette was then left in the inlet of the microfluidic device to create a plug. FIG. 12A shows the device being filled with the vinegar/seltzer water solution dyed with food color. Using a syringe, sodium bicarbonate was added to the reaction chamber, which initiated the reaction. Gas was generated as the reaction was carried out. FIGS. 12B-12C shows the formation of gas as the reaction occurs. FIG. 12D shows the displacement of the colored reactant by the gas formed as the reaction is complete. FIG. 12E shows the mark that was added where the gas and colored reagent meet after displacement of the colored liquid by the gas. Tick marks were added to the microfluidic device along the serpentine region of the microcapillary using a ruler, which allowed easy visual measurement of gas displacement of the fluid in the microfluidic device. In other rounds, a graduated pipette was used to accurately measure the volumes of reagents being added to the device.

Example 4

Materials

For 1 mold: 5 Standard microscope slides, 1 Circular reaction chamber, 1 Glass serpentine, 1 Glass J-hook, 1 Pasteur pipet. Additional materials: Duct tape, Epoxy Glass file, Aluminum foil.

Cutting a Pasteur Pipet

Figure 15:
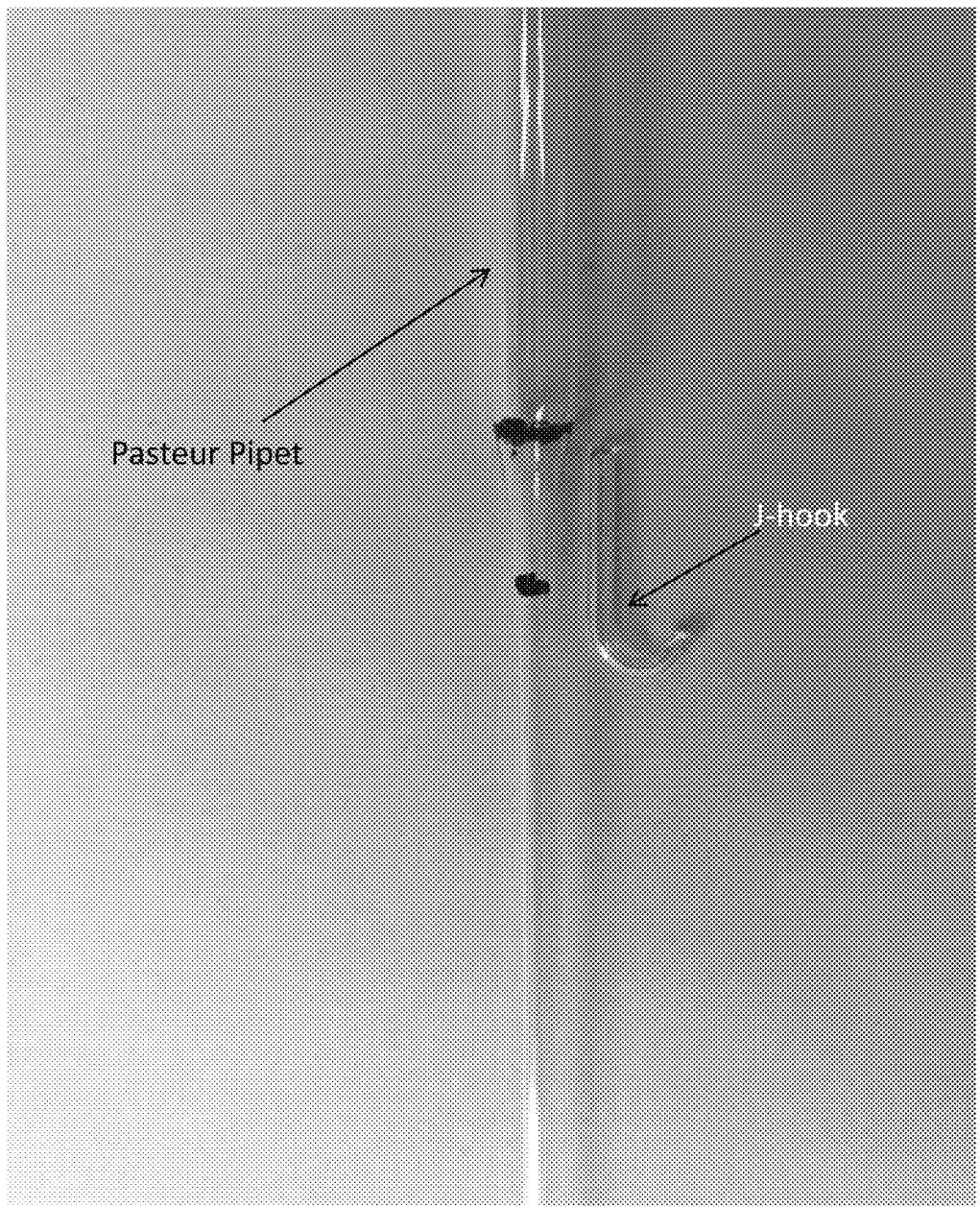
FIG. 15 shows an image of a Pasteur pipet marked at the widest part of the pipet and long enough to hit the center of the glass J-hook during preparation of a microfluidic device described herein.
Figure 16A:
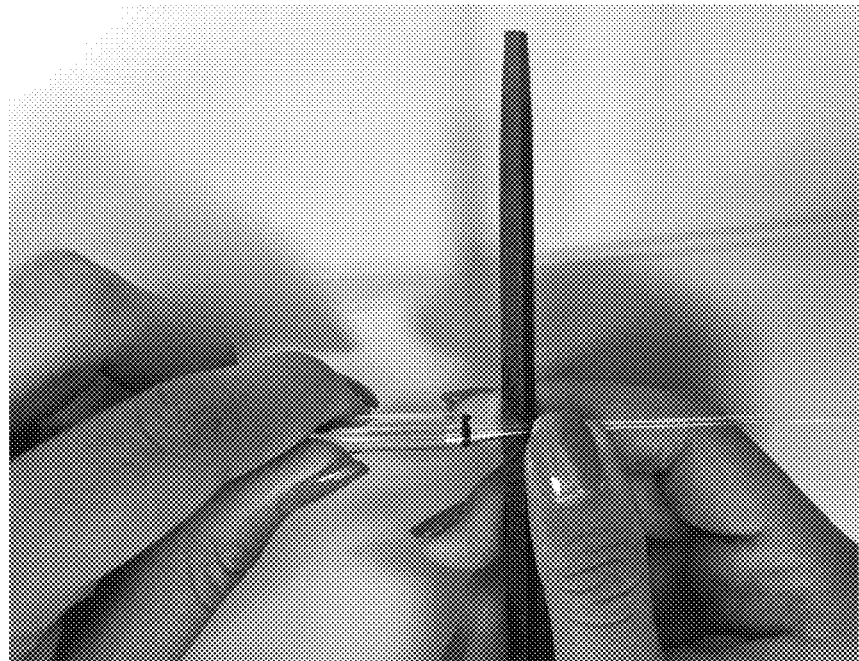
FIGS. 16A-16B show images demonstrating scoring and snapping of the Pasteur pipet at the score by placing thumbs on either side of the score and applying pressure during preparation of a microfluidic device described herein.
Figure 16B:
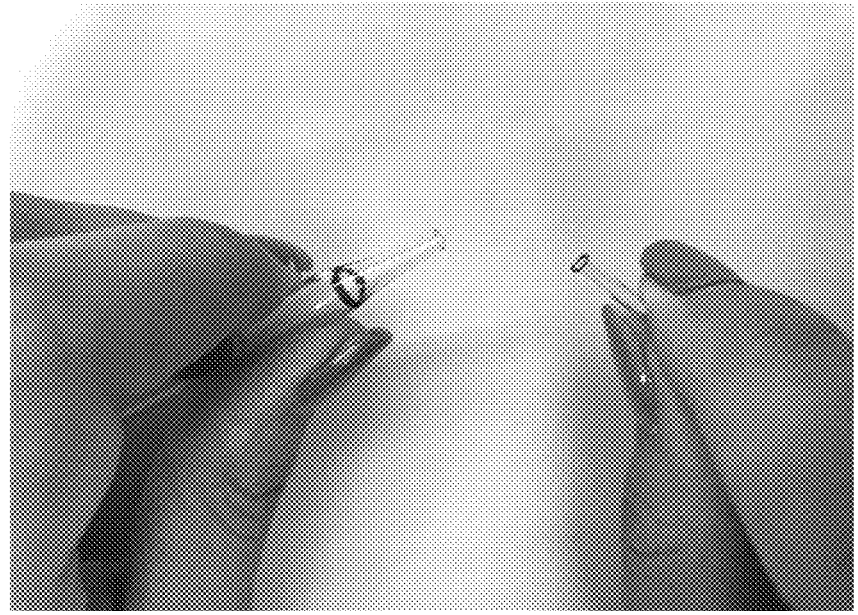

A Pastuer pipet was scored and snapped at the base to serve as the entry channel to the PDMS microfluidic device. It was be marked at the widest part of the pipet and long enough to hit the center of the glass J-hook. See e.g. FIG. 15. To score the glass, the pipet was firmly held as the glass file across was slid over the marked area. A small scratch in the glass appeared. The pipet was snapped at this point by placing thumbs on either side of the score. See e.g. FIGS. 16A-16B.

Assembling the Entry Channel

The cut pipet tip was slid over the J-hook to form a first microchannel having a tapered inlet portion. See FIGS. 14A-14B. The glass piece forming the tapered inlet portion was such that it accommodated the tip of a liquid delivery device (e.g. a pipette tip).

Gluing the Mold

Figure 17A:
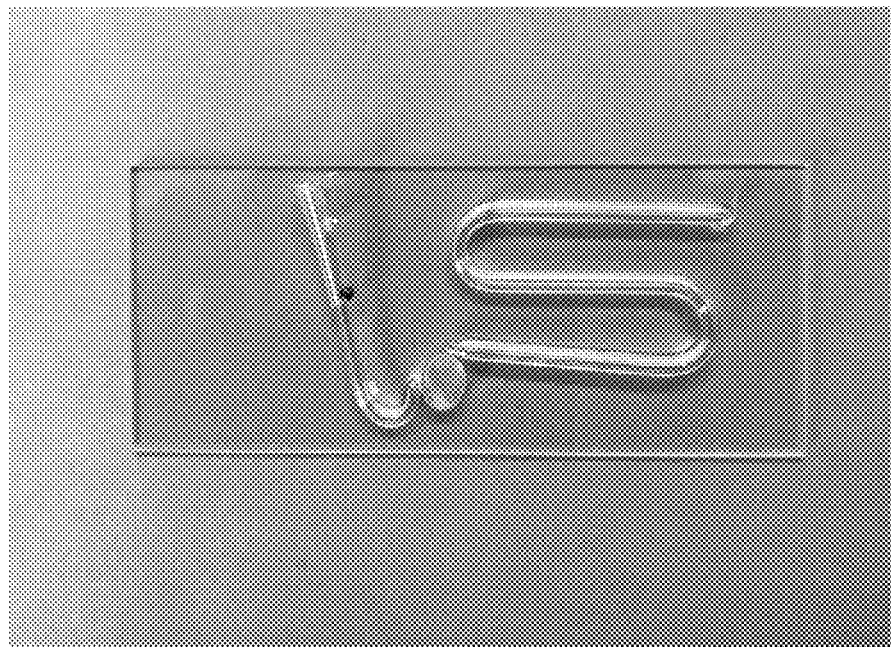
FIGS. 17A-17B show images of gluing a mold for producing a microfluidic device described herein.
Figure 17B:
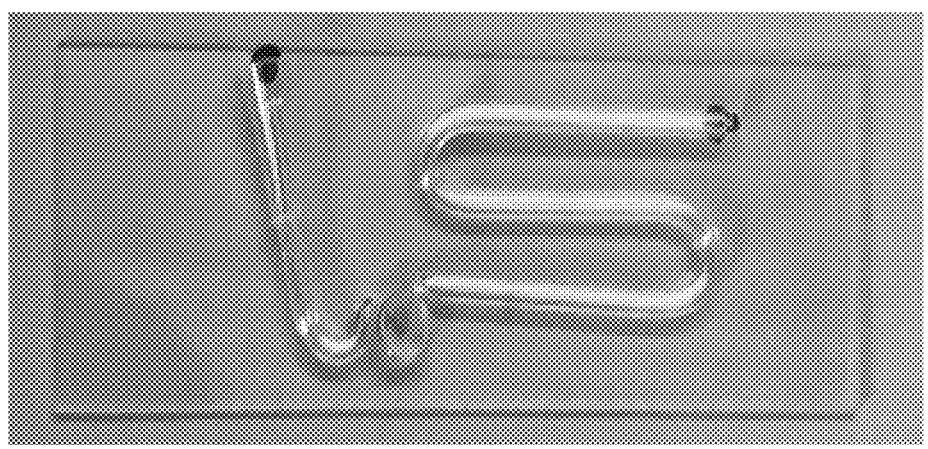

A small drop of glue was applied to each piece of glass using a toothpick. The glass serpentine was placed in the middle of the microscope slide. The circular reaction chamber was placed below the serpentine piece to allow the gas to rise into the serpentine. The J-hook and pipet tip were placed at an angle next to the circular reaction chamber. All pieces were touching. See. FIGS. 17A and 17B.

Assembling the Mold

Figure 18:
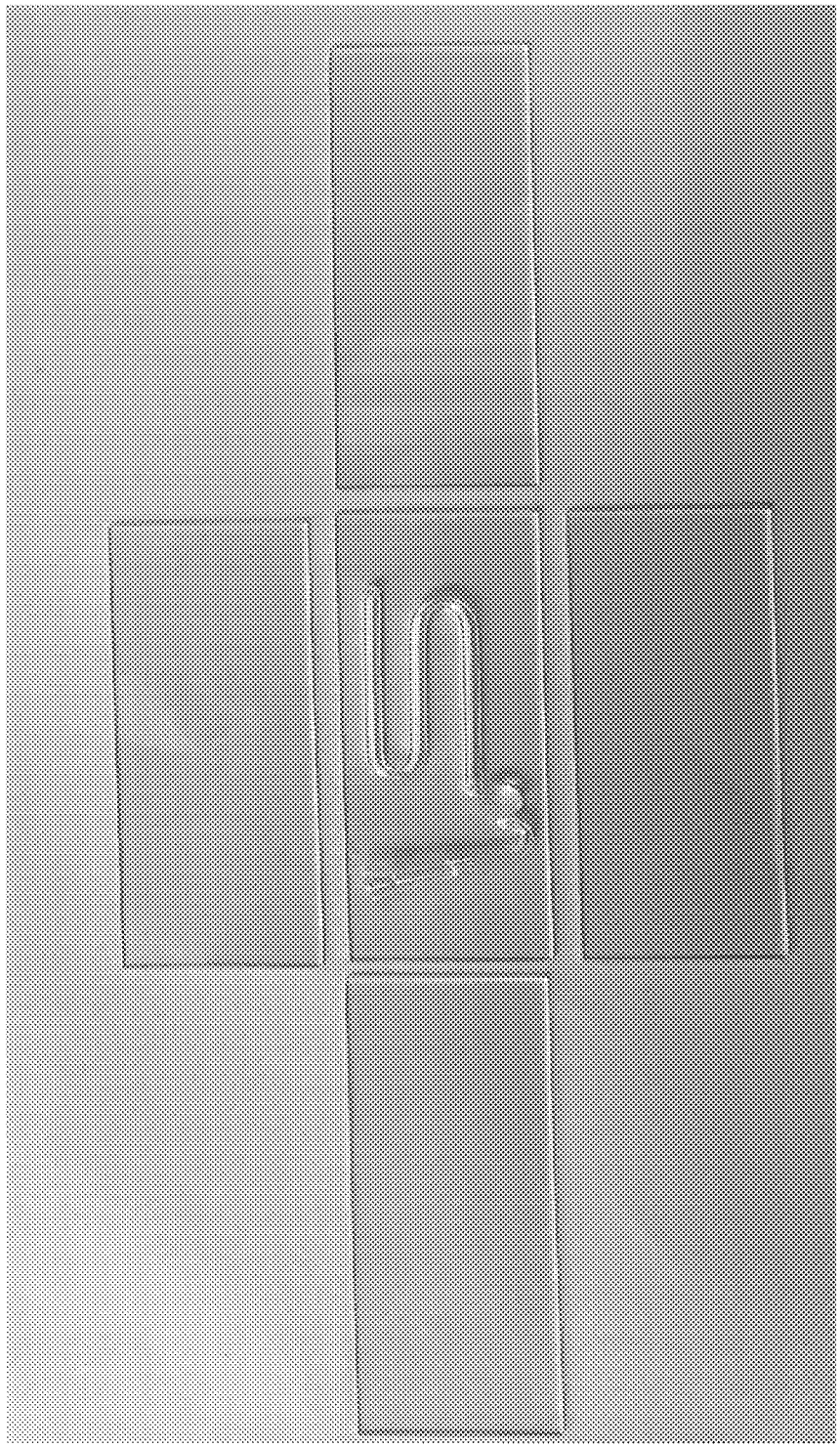
FIG. 18 shows an image of side wall assembly during assembly of a mold during production of a microfluidic device described herein.
Figure 19A:
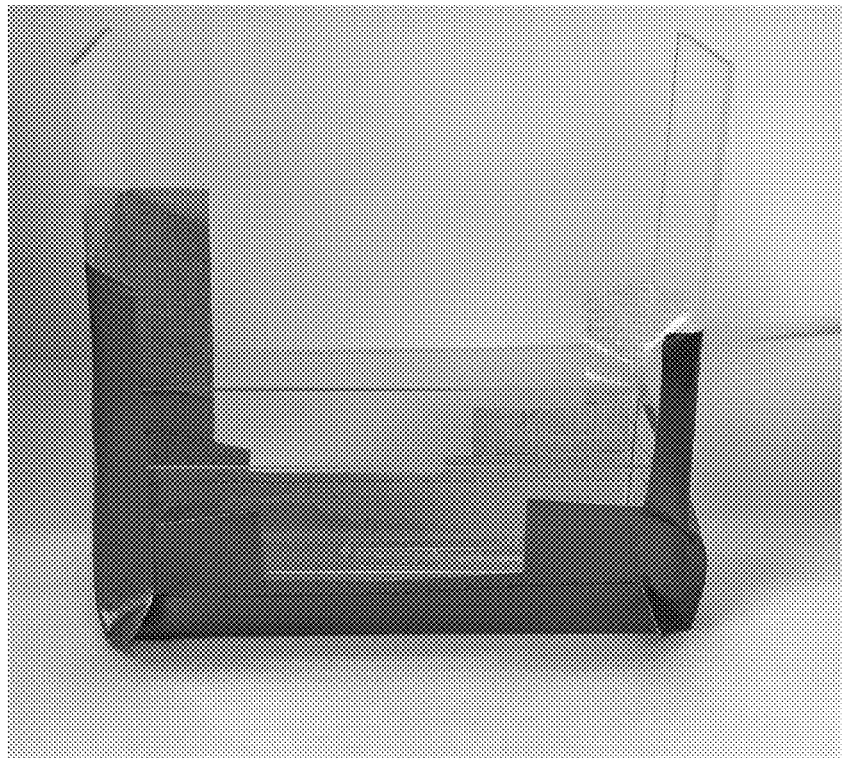
FIGS. 19A-19B shows an image of side wall assembly during assembly of a mold during production of a microfluidic device described herein.
Figure 19B:

Four glass slides were used to assemble the mold. The bottom slide was placed on a piece of duct tape. The sides walls were assembled according to FIG. 18. Duct tape was placed around the edges to provide support for the side walls. FIGS. 19A-19B.

Delamination of PDMS Microfluidic Chip

Materials. Cured PDMS microfluidic chip; Putty knife/thin piece of metal; Cuticle trimmer.

Figure 20:
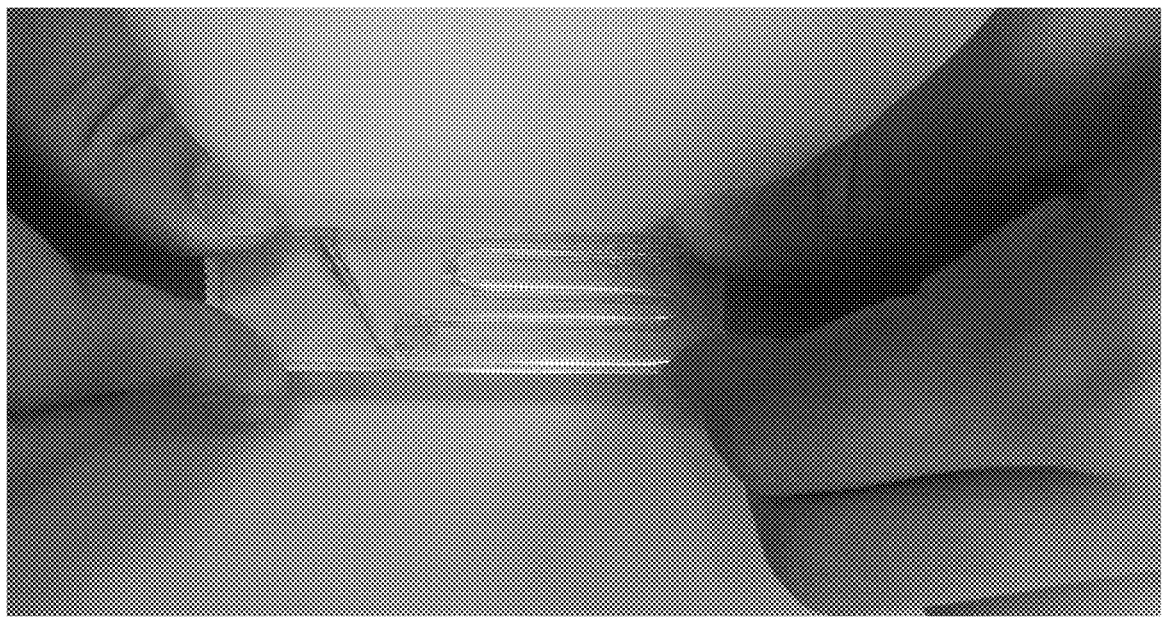
FIG. 20 shows an image demonstrating squeezing of the sides of the microfluidic device to begin release of the mold portions from the formed microfluidic device.

Method. Duct tape and foil was removed from the PDMS microfluidic mold. Sidewalls were removed from the mold starting with the shorter ends first and finishing with the longer sidewalls. To remove the side walls, pressure was applied near the middle of the microscope slide and slowly bend in toward the chip. An air bubble appeared at the bottom when the wall begun to release. The slide released from the bottom to the top. With the sidewalls removed, to release the PDMS microfluidic device from the base required patience. This step was performed slowly and carefully to avoid ripping the PDMS device. The edges of the chip were squeezed to begin release as shown in FIG. 20. This helps release the edges of the PDMS from the slide. With the edges released, a putty knife or thin piece of metal can be used to unfashion the glued pieces. This can be achieved by sliding the knife under the places that are glued. With all pieces no longer adhered, the putty knife can be used to slide underneath the mold releasing it totally from the microscope slide. With the chip removed from the slide, the glass pieces used to cast the channels were removed from the device. The dashed lines in FIGS. 21A-21D mark a path to slice using the cuticle trimmer tool. The j-hook was removed first and was done by sliding the tool under the curved portion and carefully pulling upwards until it is freed. With the end free, it was pulled straight out. The serpentine piece was removed with care to avoid breaking it. This was done by placing the tool underneath one end of the piece and carefully pulling upwards until one end is free. This process was repeated for the remaining end. With both ends freed, the serpentine piece was gently pulled upwards out of the PDMS. See the FIGS. 21A-21D for reference. The serpentine tended to break at the curved portions. The serpentine piece was removed carefully and slowly to avoid snapping any portion of the glass piece.

Using the Device

Figure 22:
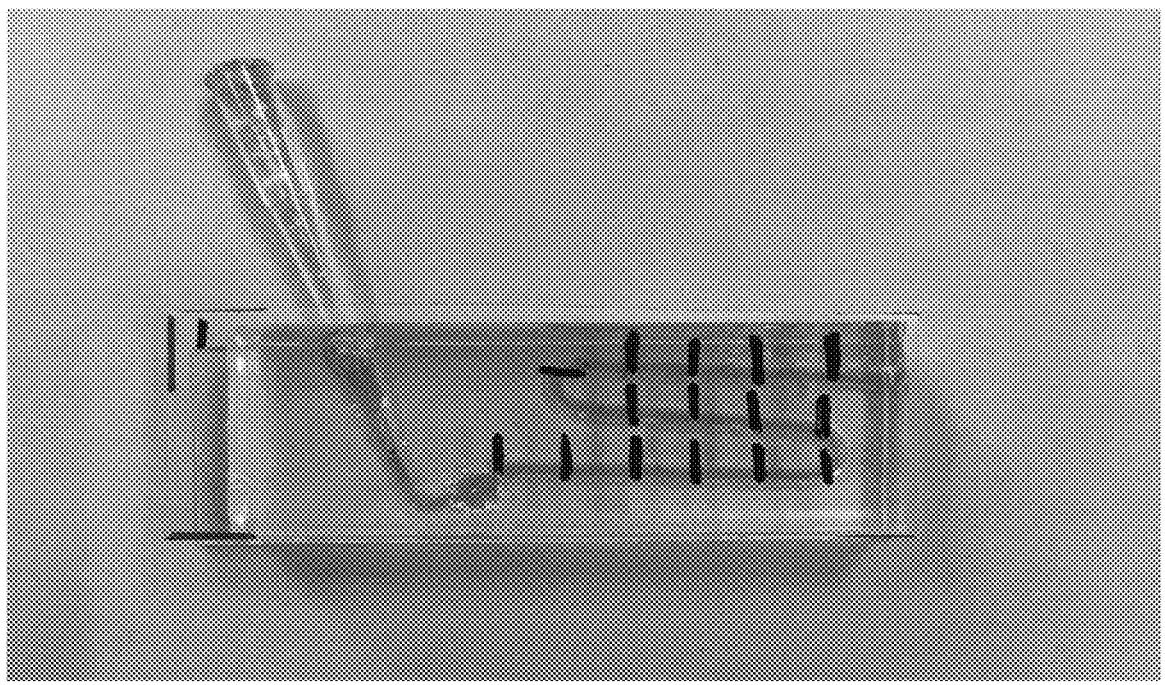
FIG. 22 shows an image of a microfluidic device described herein in use.

The PDMS microfluidic device was filled with seltzer water colored blue using food coloring. The microliters of blue seltzer water it takes to fill the PDMS microfluidic device was recorded. This can be repeated as desired. In this Example, the question considered was how many significant figures should be used. The steps above were repeated 3 times and the average and standard deviation was recorded. Marks can be placed in the serpentine region and the fluid can be used to determine how many significant figures each mark in the serpentine region. See FIG. 22. About 40 uL of sodium bicarbonate was delivered into the entry channel via a calibrated 100 uL pipit tip. 40 uL of the acetic acid was delivered n the same manner. The inlet of the device was plugged with an epoxy-filled 100 uL pipet tip and wait for $CO_2$ generation. Once the reaction was complete, using blue seltzer water, the gas was pushed forward into the serpentine piece of the device to aid in visualization and volume measurement. Each tick mark in FIG. 22 represents 25 uL as determined by earlier calibration.

Example 5

Removing the PDMS Microfluidic Chip from the Mold and Assembling the Chip.

The objective is to remove glass casting pieces and obtain a flat surface on the PDMS microfluidic device to obtain a seal to the glass side.

Materials. Putty knife/thin piece of metal; Cured PDMS microfluidic chip; Cuticle tool; Dish soap; An oven maintained at 80° C.; A flat piece of metal serving as a weight to create pressure during the sealing process.

Methods. The device was formed as discussed in Example 4. Once the PDMS was completely free of the glass mold, the edges were examined for any leftover pieces of PDMS that would prevent the PDMS device from sealing to the glass base. Any leftover pieces found were trimmed and removed. Once it was been established that the PDMS surface is smooth, the sealing surface and the microscope slide was washed with dish soap and rinse it copiously with water being careful to not touch or contaminate the surface, for example with fingers, a towel, or a disposable wipe. The PDMS device was gently shook to remove additional droplets of water. A dry surface is needed for the seal. The glass slide and the PDMS device were placed face-up in an oven to dry (~80° C.). Placing the device and slide face up ensured that the surfaces that were pressed together to be sealed were not in contact with particles or dirt on the oven surface. Once it has been established that the device is dry it was removed from the oven, keeping the sealing surface face up, and was allowed to cool.

The PDMS was pressed to the glass microscope slide ensuring that no air, particulate, or dirt is in between the glass and the PDMS. Once the seal was satisfactory, the device was placed back in the 80° C. oven with the glass surface on the oven surface and the PDMS device on top. A flat metal piece was placed on top of the PDMS, as shown in the figure below, to add additional pressure to the interface between the glass and the PDMS. The device was kept in the oven for 1 hour. The weight was removed and the device was allowed to cool to room temperature. Once cooled, the device was ready for use. While it was reversibly sealed, the seal obtained with heating was stronger than for a device that has been pressed together without heat.

I claim:

1. A microfluidic device comprising:
    a first microcapillary, wherein the first microcapillary has an end region having a J-hook shape comprising a semicircular curved portion extending from a straight section of the first microcapillary, wherein the first microcapillary has an inlet, wherein the inlet is at an end opposite the end region having the J-hook shape, wherein the end region of the microcapillary has an outlet, wherein the outlet is at an end opposite the end with the inlet, wherein the outlet of the first microcapillary is at a lower height than the inlet in the microfluidic device;
    a reaction chamber, wherein the reaction chamber has an inlet and an outlet, wherein the inlet of the reaction chamber is coupled to the outlet of the end region of the first microcapillary, wherein the inlet of the reaction chamber is positioned at a height lower than the outlet of the reaction chamber in the microfluidic device, wherein the reaction chamber has a greater width than the first microcapillary; and
    a second microcapillary, wherein the second microcapillary comprises an inlet and an outlet, wherein the second microcapillary is serpentine shaped with a path that reverses direction in at least one region between the inlet and the outlet of the second microcapillary, wherein the inlet of the second microcapillary is coupled to the outlet of the reaction chamber, wherein the inlet of the second microcapillary is at a lower height than the outlet of the second microcapillary in the microfluidic device.

2. The microfluidic device of claim 1, wherein the microfluidic device comprises a polymer.

3. The microfluidic device of claim 1, wherein the microfluidic device comprises poly(dimethyl siloxane).

4. The microfluidic device of claim 1, wherein the reaction chamber is substantially spherical.

5. The microfluidic device of claim 1, wherein the at least one region of the second microcapillary has at least two turns that each reverse direction of the path.

6. The microfluidic device of claim 1, wherein a total volume of the first microcapillary, second microcapillary, and the reaction chamber ranges from about 0.25 mL to about 10 mL.

7. The microfluidic device of claim 1, wherein a volume of the first microcapillary is less than a volume of the second microcapillary.

8. The microfluidic device of claim 1, wherein the inlet of the first microcapillary is configured to receive a pipette tip.

9. The microfluidic device of claim 1, wherein the first microcapillary is substantially straight between the inlet and the end region having the J-hook shape.

10. A method of using the microfluidic device as in claim 1, the method comprising:
    delivering a first reagent to the microfluidic device through the inlet of the first microcapillary until it fills the first microcapillary, the reaction chamber, and the second microcapillary;
    delivering a second reagent to the microfluidic device through the inlet of the first microcapillary;
    delivering a third reagent to the microfluidic device through the inlet of the first microcapillary; and
    plugging or sealing the first microcapillary such that the reagents present in the first microcapillary are moved into at least the reaction chamber.

11. The method of claim 10, further comprising the step of incubating reagents within the microfluidic device for a period of time.

12. The method of claim 11, further comprising the step of quantifying an amount of gas formed by measuring a displacement of the first reagent in the second microcapillary.

13. The method of claim 10, wherein the first reagent is dyed with a color producing compound.

14. The method of claim 10, wherein the first reagent is dyed with a generally recognized as safe dye.

15. The method of claim 10, wherein the first reagent is dyed with a food coloring.

16. The method of claim 10, wherein the first reagent is seltzer water or sparkling water.

17. The method of claim 10, wherein the second reagent is acetic acid or calcium chloride.

18. The method of claim 10, wherein the second reagent is a limiting reagent.

19. The method of claim 10, wherein the third reagent is sodium bicarbonate.

20. The method of claim 10, wherein the third reagent is an excess reagent.

* * * * *